(12) United States Patent
Ukigaya et al.

(10) Patent No.: US 10,580,834 B2
(45) Date of Patent: Mar. 3, 2020

(54) DISPLAY DEVICE HAVING ORGANIC LAYER BETWEEN FIRST ELECTRODES AND SECOND ELECTRODE AND INSULATING FILM COVERING SIDE FACE OF FIRST ELECTRODES, METHOD OF MANUFACTURING THE SAME, AND ELECTRONIC APPARATUS

(71) Applicant: CANON KABUSHIKI KAISHA, Tokyo (JP)

(72) Inventors: Nobutaka Ukigaya, Oita (JP); Tetsuya Kimura, Fuchu (JP); Daisuke Okabayashi, Zama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/044,785

(22) Filed: Jul. 25, 2018

(65) Prior Publication Data

US 2019/0043934 A1 Feb. 7, 2019

(30) Foreign Application Priority Data

Aug. 4, 2017 (JP) .................................. 2017-151762

(51) Int. Cl.
*H01L 27/32* (2006.01)
*H01L 51/52* (2006.01)
(Continued)

(52) U.S. Cl.
CPC ....... *H01L 27/3218* (2013.01); *G09G 3/3225* (2013.01); *G09G 3/3233* (2013.01);
(Continued)

(58) Field of Classification Search
CPC ............ H01L 51/0024; H01L 51/0032; H01L 51/4213; H01L 51/428; H01L 51/441; H01L 51/424; H01L 51/442; H01L 51/5203; H01L 51/5215; H01L 51/5296; H01L 52/102; H01L 52/18; H01L 23/22; H01L 23/24
See application file for complete search history.

(56) References Cited

U.S. PATENT DOCUMENTS 6,642,651 B2 * 11/2003 Yudasaka ............ H01L 27/3246
313/504
8,569,774 B2 10/2013 Yuasa
(Continued)

FOREIGN PATENT DOCUMENTS

JP 5677290 B2 2/2015
WO 2012/014252 A1 2/2012

*Primary Examiner* — Thanh Y. Tran
(74) *Attorney, Agent, or Firm* — Venable LLP

(57) ABSTRACT

A disclosed display device includes first electrodes, a second electrode, an organic layer arranged between the first electrodes and the second electrode, and an insulating film configured to cover at least a side face of each of the first electrodes. The insulating film includes a first insulating layer configured to cover at least a part of the side face of each of the first electrodes, and a second insulating layer configured to cover the side face. The first insulating layer is arranged between the side face and the second insulating layer, and includes a first part and a second part whose density is lower than a density of the first part.

14 Claims, 20 Drawing Sheets

(51) Int. Cl.
*H01L 51/56* (2006.01)
*G09G 3/3266* (2016.01)
*G09G 3/3233* (2016.01)
*G09G 3/3225* (2016.01)

(52) U.S. Cl.
CPC ......... *G09G 3/3266* (2013.01); *H01L 27/322* (2013.01); *H01L 27/3258* (2013.01); *H01L 51/5209* (2013.01); *H01L 51/5221* (2013.01); *H01L 51/56* (2013.01); *G09G 2300/0426* (2013.01); *G09G 2300/0819* (2013.01); *G09G 2300/0842* (2013.01); *G09G 2310/0281* (2013.01); *H01L 51/5218* (2013.01)

(56) References Cited

U.S. PATENT DOCUMENTS

2014/0145153 A1* 5/2014 Kim .................. H01L 27/124
                                                     257/40
2017/0279071 A1* 9/2017 Tamekawa .......... H01L 27/3244

* cited by examiner

FIG. 12
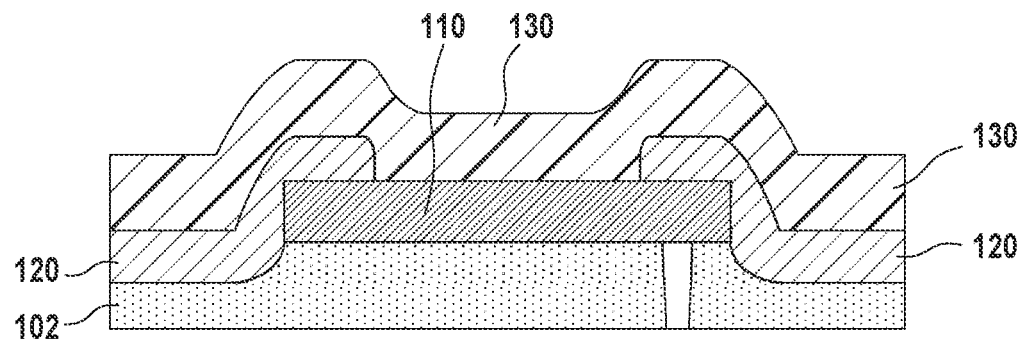
FIG. 13A
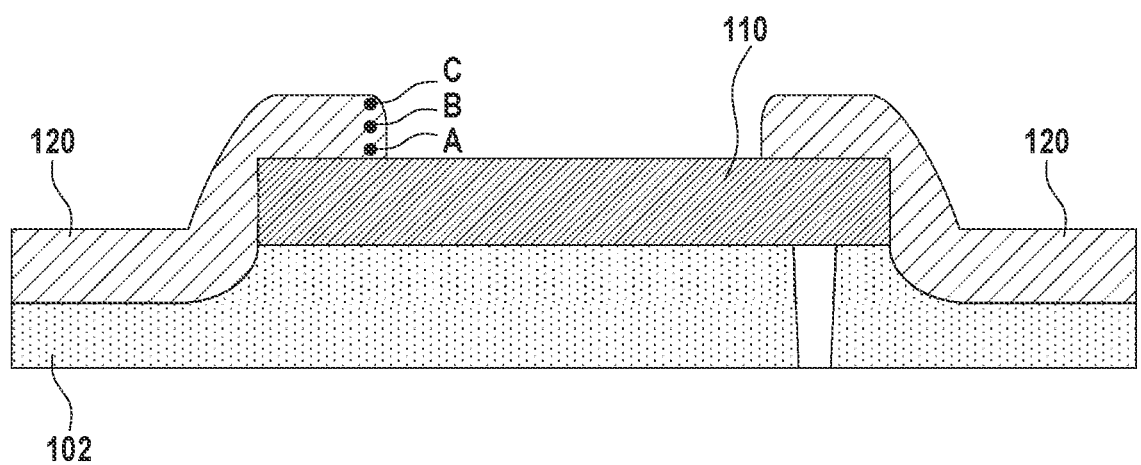
FIG. 13B
| POSITION | Ar CONTENT |
|----------|------------|
| C | LARGE |
| B | MEDIUM |
| A | SMALL | ize # DISPLAY DEVICE HAVING ORGANIC LAYER BETWEEN FIRST ELECTRODES AND SECOND ELECTRODE AND INSULATING FILM COVERING SIDE FACE OF FIRST ELECTRODES, METHOD OF MANUFACTURING THE SAME, AND ELECTRONIC APPARATUS

BACKGROUND

Field of the Invention

The present invention relates to a display device, a method of manufacturing the same, and an electronic apparatus.

Description of the Related Art

A display device including an organic layer as a light emitting layer has attracted attention. In this display device, light is generated by recombining electrons injected from a cathode and holes injected from an anode in the light emitting layer, and is extracted through the cathode or anode. It is known that, in the display device, if a pixel regulation layer that covers a gap between lower electrodes and the end portion of each lower electrode is formed using a sputtering method or a CVD method, the side face of each lower electrode is not covered completely with the pixel regulation layer, and thus the lower electrode and an upper electrode may be short-circuited.

International Publication No. WO 2012/014252 (to be referred to as PTL 1 hereinafter) describes that a reason why the side face of each lower electrode is not covered completely with the pixel regulation layer is that the step coverage of a film formation method such as the sputtering method or CVD method is insufficient. As an arrangement capable of solving this problem, PTL 1 discloses an arrangement in which each first electrode is formed by a reflective metal film and a transparent electrode film stacked thereon, and not a transparent electrode film but a metal oxide film obtained by oxidizing the reflective metal film is provided in the end portion of each first electrode. A second electrode is arranged on a light emitting layer on the first electrodes.

The invention described in PTL 1 forms a metal oxide film by a method of oxidizing the reflective metal film instead of forming the pixel regulation layer by the sputtering method or CVD method in which sufficient step coverage cannot be obtained. However, in the invention described in PTL 1, it is necessary to obtain a metal oxide film with sufficient quality in an oxidization step, and a material of the reflective metal film is limited. Furthermore, PTL 1 does not consider a case in which the quality of the metal oxide film obtained by oxidizing the reflective metal film is insufficient. If the quality of the metal oxide film is insufficient, the first electrode and the second electrode may be short-circuited, a current path from an undesirable part of the first electrode to the light emitting layer may be formed, or water may enter the light emitting layer.

SUMMARY OF THE INVENTION

The present invention has as its object to provide, in a display device including an insulating film so as to cover the side face of each first electrode, a technique advantageous in improving the quality of the insulating film while relaxing a limitation on the constituent material of each first electrode.

According to one aspect of the present invention, there is provided a display device comprising first electrodes, a second electrode, an organic layer arranged between the first electrodes and the second electrode, and an insulating film configured to cover at least a side face of each of the first electrodes, the insulating film including a first insulating layer configured to cover at least a part of the side face of each of the first electrodes, and a second insulating layer configured to cover the side face, the first insulating layer being arranged between the side face and the second insulating layer, and including a first part and a second part whose density is lower than a density of the first part.

Further features of the present invention will become apparent from the following description of exemplary embodiments with reference to the attached drawings.

BRIEF DESCRIPTION OF THE DRAWINGS

FIG. 12 is a view schematically showing the sectional structure of the display device according to the fifth embodiment;

FIG. 13A is a view showing positions in a thickness direction in a formed insulating film, according to the fifth embodiment;

FIG. 13B is a table exemplifying the relationship between the positions in the thickness direction in the formed insulating film and Ar contents at the positions, according to the fifth embodiment;

DESCRIPTION OF THE EMBODIMENTS

The present invention will be described below with reference to the accompanying drawings by way of exemplary embodiments.

Figure 1:
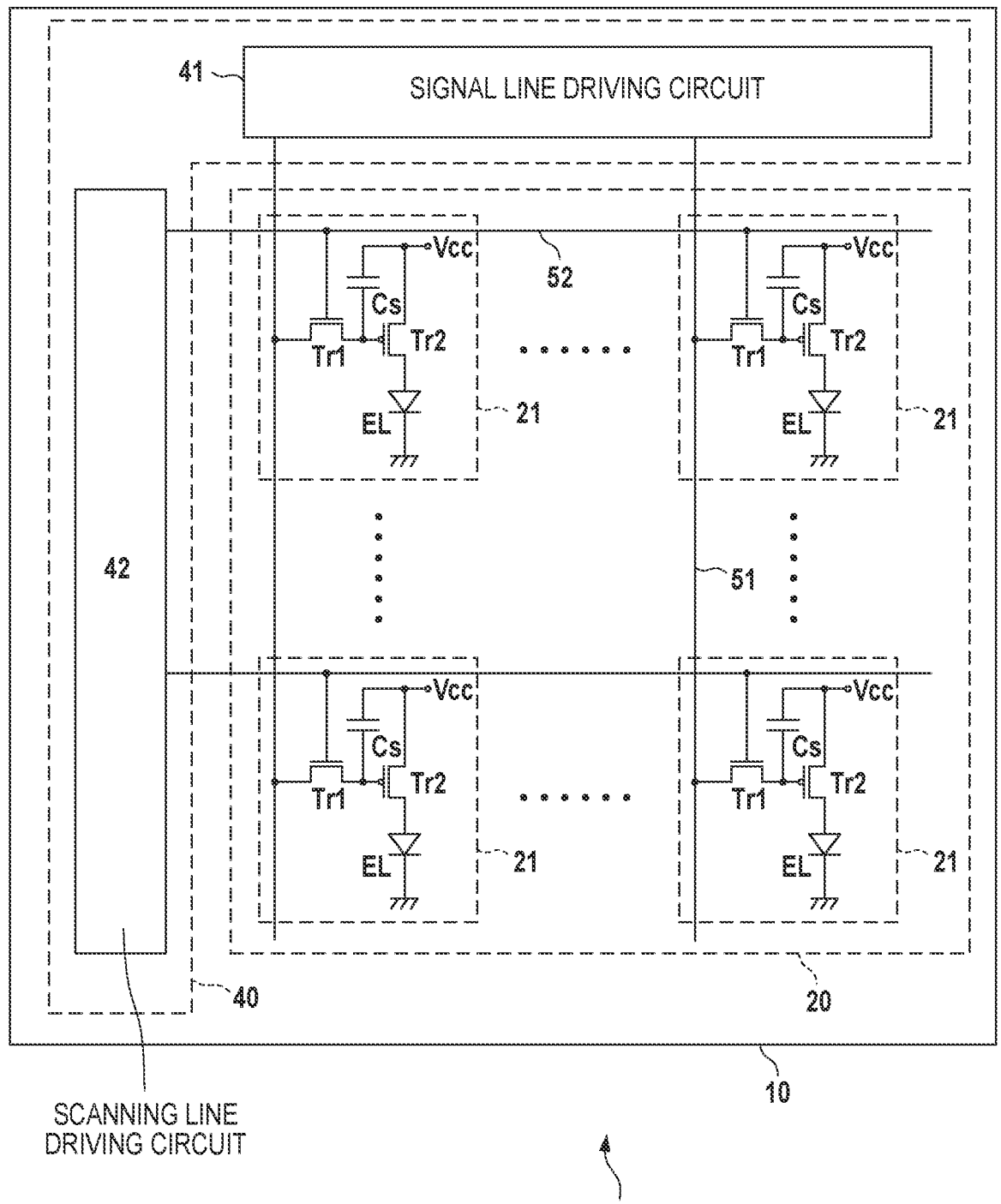
FIG. 1 is a circuit diagram showing the arrangement of a display device according to one embodiment.

FIG. 1 shows the arrangement of a display device 1 according to the first embodiment of the present invention. The display device 1 includes a pixel region 20 and a peripheral circuit region 40. In the pixel region 20, a plurality of sub-pixels 21 are arranged. Each sub-pixel 21 can be, for example, an R (red), G (green), or B (blue) sub-pixel. The peripheral circuit region 40 can include a signal line driving circuit 41 and a scanning line driving circuit 42. The pixel region 20 and the peripheral circuit region 40 can be arranged on a substrate 10.

Each sub-pixel 21 is an active sub-pixel, and can include, for example, an organic light emitting device EL, a write transistor Tr1, a driving transistor Tr2, and a holding capacitance Cs. The organic light emitting device EL and the driving transistor Tr2 are serially connected between a first power supply line Vcc and a second power supply line (ground). The holding capacitance Cs has one end connected to a connection node of the write transistor Tr1 and the driving transistor Tr2, and the other end connected to the first power supply line Vcc. One of the two main electrodes (source and drain) of the write transistor Tr1 is connected to a signal line 51, and the other is connected to the gate of the driving transistor Tr2. Furthermore, the gate of the write transistor Tr1 is connected to a scanning line 52. The signal line driving circuit 41 drives the plurality of signal lines 51. The scanning line driving circuit 42 drives the plurality of scanning lines 52. The signal line driving circuit 41 outputs an image signal to each of the plurality of signal lines 51, and the write transistors Tr1 of the sub-pixels 21 on a row selected by the scanning line driving circuit 42 are turned on, thereby writing the image signal in each of the holding capacitances Cs of the sub-pixels 21.

Figure 2:
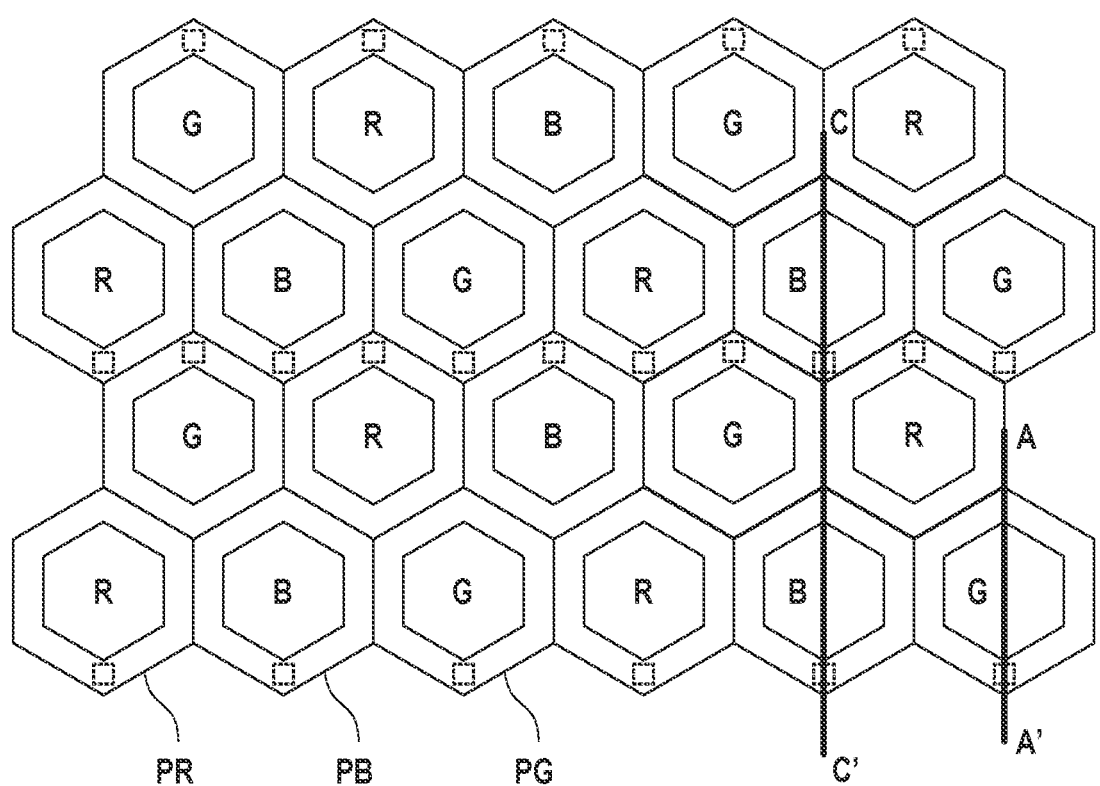
FIG. 2 is a view exemplifying the array of sub-pixels.

FIG. 2 exemplifies the array of the sub-pixels 21. Each sub-pixel 21 is represented as an R sub-pixel PR, a G sub-pixel PG, or a B sub-pixel PB. In this example, each sub-pixel has a hexagonal shape but may have another shape (for example, a rectangular shape or another polygonal shape). The plurality of sub-pixels may be arrayed in a matrix or another arrangement. In an example, the array pitch of the sub-pixels is about 5 μm, and the array pitch of pixels each formed by the R sub-pixel PR, G sub-pixel PG, and B sub-pixel PB is about 8 μm. This embodiment will explain an example in which one pixel is formed by three sub-pixels. However, one pixel may be formed by four or more sub-pixels.

Figure 3:
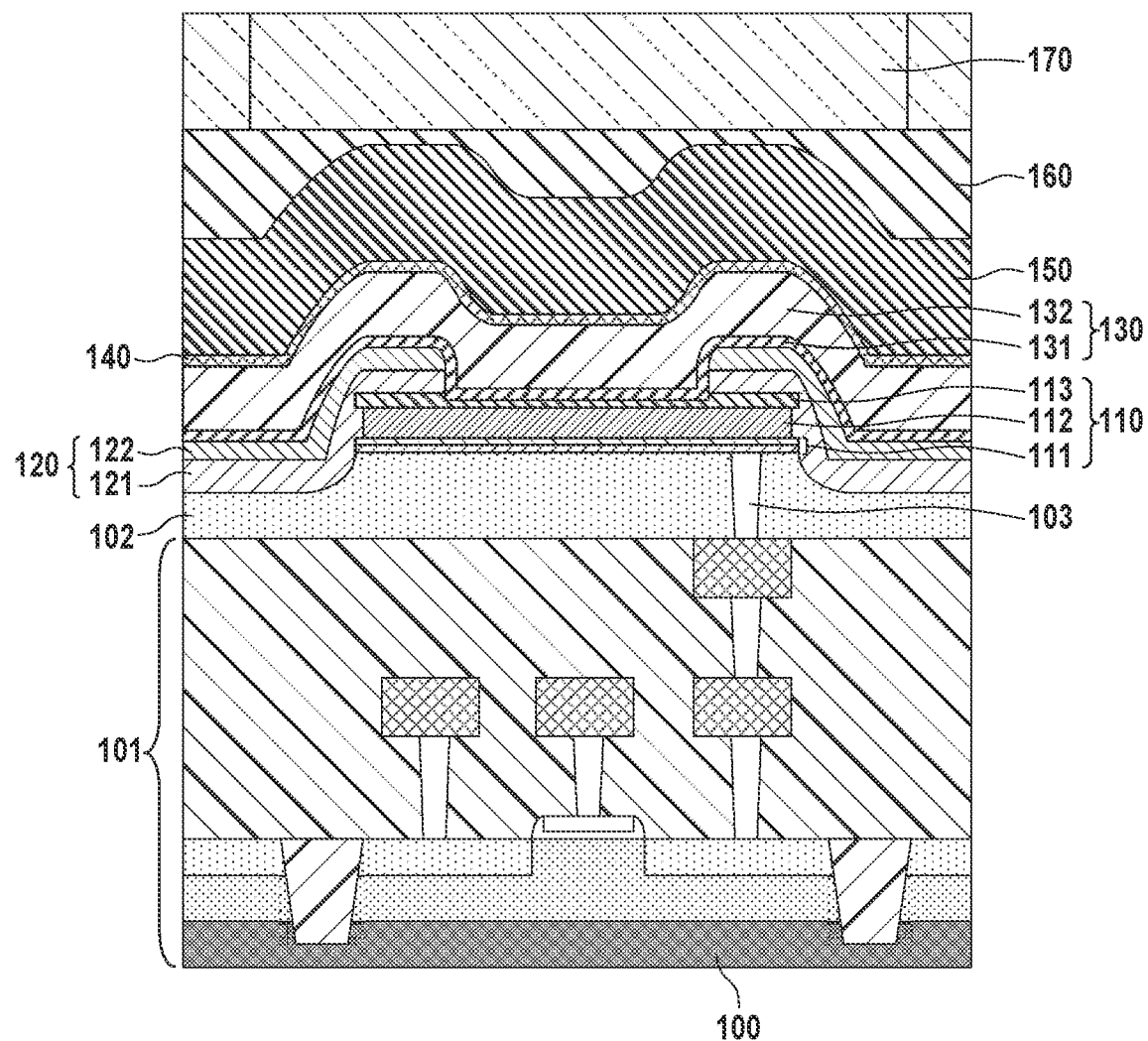
FIG. 3 is a view schematically showing the sectional structure of the display device according to the first embodiment.

FIG. 3 schematically shows a sectional structure taken along a line A-A' in FIG. 2. Among the components of each sub-pixel 21, the write transistor Tr1, driving transistor Tr2, and holding capacitance Cs for driving the organic light emitting device EL form a driving circuit, and are arranged in a driving circuit layer 101. In the driving circuit layer 101, a light-shielding layer that blocks stray light entering the write transistor Tr1 and the driving transistor Tr2 can be arranged. The driving circuit layer 101 may include a semiconductor substrate 100, and the active regions of the write transistor Tr1 and driving transistor Tr2 can be formed in the semiconductor substrate 100. Alternatively, the write transistor Tr1 and the driving transistor Tr2 can be formed on an insulating substrate such as a glass substrate. The insulating substrate may be a substrate including an insulating film on the surface of an electrically conductive substrate.

An interlayer insulating layer 102 is arranged on the driving circuit layer 101, and the organic light emitting device EL of the R sub-pixel PR, G sub-pixel PG, or B sub-pixel PB is arranged on the interlayer insulating layer 102. The display device 1 can include a plurality of first electrodes (anodes) 110, an insulating film 120 that covers at least the side face of each of the plurality of first electrodes 110, and an organic layer 130 arranged on the plurality of first electrodes 110 and the insulating film 120. The display device 1 can include a second electrode (cathode) 140 arranged on the organic layer 130. Each organic light emitting device EL is formed by the first electrode 110, the organic layer 130, and the second electrode 140. The plurality of organic light emitting devices EL are separated by the insulating film 120. The second electrode 140 can be provided commonly to the plurality of organic light emitting devices EL. A moisture resistant layer 150, a planarization layer 160, and color filter layers 170 can be arranged on the organic light emitting devices EL.

The insulating film 120 includes a first insulating layer 121 that covers at least a part of the side face of each of the plurality of first electrodes, and a second insulating layer 122 that covers the side face of each of the plurality of first electrodes. The first insulating layer 121 is arranged between the side face of each of the plurality of first electrodes and the second insulating layer 122. The organic layer 130 can include a plurality of layers arranged on the plurality of first electrodes 110 and the insulating film 120. For the sake of simplicity, FIG. 3 shows a hole injection layer 131 and a multilayer 132 as the plurality of layers forming the organic layer 130. The multilayer 132 can have a structure in which a hole transport layer, a light emitting layer, and an electron transport layer are stacked sequentially from the side of the hole injection layer 131.

The color filter layers 170 may be formed on the moisture resistant layer 150, or bonded to the planarization layer 160 while being supported by a support substrate (not shown). In the latter case, a moisture resistant layer may be provided in the support substrate. The organic layer 130 can be provided commonly to the plurality of pixels (the plurality of first electrodes 110). In this example, the organic layer 130 generates white light, and the color filter layers 170 of R, G, and B colors pass R, G, and B light beams, respectively.

Each component will be exemplarily described in detail below. Since small connection holes are formed in the interlayer insulating layer 102, the interlayer insulating layer 102 is preferably manufactured by a material that can obtain high processing accuracy. Each connection hole is embedded with a plug 103 made of an electrically conductive metal. The driving transistor Tr2 of the driving circuit layer 101 is electrically connected to the first electrode 110 via the plug 103. The interlayer insulating layer 102 can be made of, for example, an organic material such as acryl or polyimide or an inorganic material such as silicon oxide (SiOx), silicon nitride (SiNx), or silicon oxynitride (SiON).

The first electrodes 110 are electrically isolated for each sub-pixel. Each first electrode 110 also functions as a reflecting layer. It is possible to improve the light emitting efficiency of the organic light emitting device EL by improving the reflectance of each first electrode 110. The thickness of each first electrode 110 can fall within a range of, for example, 30 nm to 1,000 nm. Each first electrode 110 can include a plurality of electrically conductive material layers arranged on the interlayer insulating layer 102 serving as an underlayer. Each first electrode 110 can be formed by stacking, sequentially from the side of the interlayer insulating layer 102 serving as an underlayer, a barrier metal layer 111, a reflective metal layer 112, and an injection efficiency adjustment layer 113 for adjusting the hole injection efficiency. The barrier metal layer 111 may be a single layer or have a stacked structure. The barrier metal layer 111 can be formed by stacking, from the side of the interlayer insulating layer 102, T1 having a thickness falling within a range of 10 to 100 nm and TiN having a thickness falling within a range of 10 to 100 nm. The reflective metal layer 112 preferably has a reflectance of 70% or more in a visible light region. The reflective metal layer 112 can be made of Al (aluminum), Ag (silver), or an alloy containing at least one of them. The reflective metal layer 112 can have a thickness of 50 nm or more to obtain a high reflectance. On the other hand, the upper limit of the thickness of the reflective metal layer 112 can be determined so that the organic layer 130 and second electrode 140 formed on the reflective metal layer 112 can sufficiently cover steps formed by the first electrodes 110. In addition or alternatively, the upper limit of the thickness of the reflective metal layer 112 can be determined in consideration of the roughness of the surface of the reflective metal layer 112.

For example, the thickness of each first electrode 110 is preferably smaller than that of the organic layer 130 arranged between the first electrodes 110 and the second electrode 140. If the reflective metal layer 112 is made of aluminum or an aluminum alloy, the injection efficiency adjustment layer 113 is preferably provided on the reflective metal layer 112 to prevent oxidization of the surface of the reflective metal layer 112 and improve the hole injection efficiency. The injection efficiency adjustment layer 113 can be made of a refractory metal such as Ti, W, Mo, Cr, or Ta, an alloy containing at least one of them, or a transparent electrode material such as ITO or IZO. If a refractory metal such as Ti is used for the injection efficiency adjustment layer 113, the thickness of the injection efficiency adjustment layer 113 is preferably set to 50 nm or smaller in consideration of a decrease in reflectance of each first electrode 110. The hole injection layer 131 provided on the first electrodes 110 is preferably made of a material with a low resistance value in terms of the hole injection performance.

The first insulating layer 121 can be provided to cover at least a part of the side face of each first electrode 110. For example, the first insulating layer 121 can have a thickness falling within a range of 1 nm to 100 nm. The first insulating layer 121 can be made of, for example, an organic material such as acryl or polyimide or an inorganic material such as silicon oxide (SiOx), silicon nitride (SiNx), or silicon oxynitride (SiON). The first insulating layer 121 is preferably made of a material having a low moisture content so the organic layer 130 does not deteriorate due to the influence of water. The first insulating layer 121 defines a light emitting region on each first electrode 110. The first insulating layer 121 is arranged to extend between the first electrodes 110 arrayed adjacent to each other, and has an opening in a part corresponding to the light emitting region on each first electrode 110 while covering a peripheral part of the upper face of each first electrode 110. In another aspect, the first insulating layer 121 may be arranged to extend between the first electrodes 110 arrayed adjacent to each other, and has an opening in a part corresponding to the light emitting region on each first electrode 110 while covering an end of each first electrode 110. The end of the first electrode 110 may include a side face of the first electrode 110 and an outer part of the upper face of the first electrode 110.

The second insulating layer 122 is provided between the first insulating layer 121 and the organic layer 130. The second insulating layer 122 can be arranged to cover the side face of each first electrode 110 via the first insulating layer 121. The thickness of the second insulating layer 122 can fall within a range of 1 nm to 100 nm. The second insulating layer 122 can be made of, for example, an organic material such as acryl or polyimide or an inorganic material such as silicon oxide (SiOx), silicon nitride (SiNx), or silicon oxynitride (SiON). One of materials having low moisture contents is selected for the second insulating layer 122 so the organic layer 130 does not deteriorate due to the influence of water. The second insulating layer 122 has an opening in a part corresponding to the light emitting region on each first electrode 110 while covering the peripheral part of the upper face of each first electrode 110 via the first insulating layer 121.

A step of the opening formed by the insulating film 120 including the first insulating layer 121 and the second insulating layer 122 on the first electrode 110 can be determined so that the second electrode 140 arranged on the organic layer 130 on the opening can sufficiently cover a step on the upper face of the organic layer 130. The step of the opening formed by the insulating film 120 on each first electrode 110 preferably has, for example, a thickness equal to or smaller than that of the organic layer 130.

Figure 4:
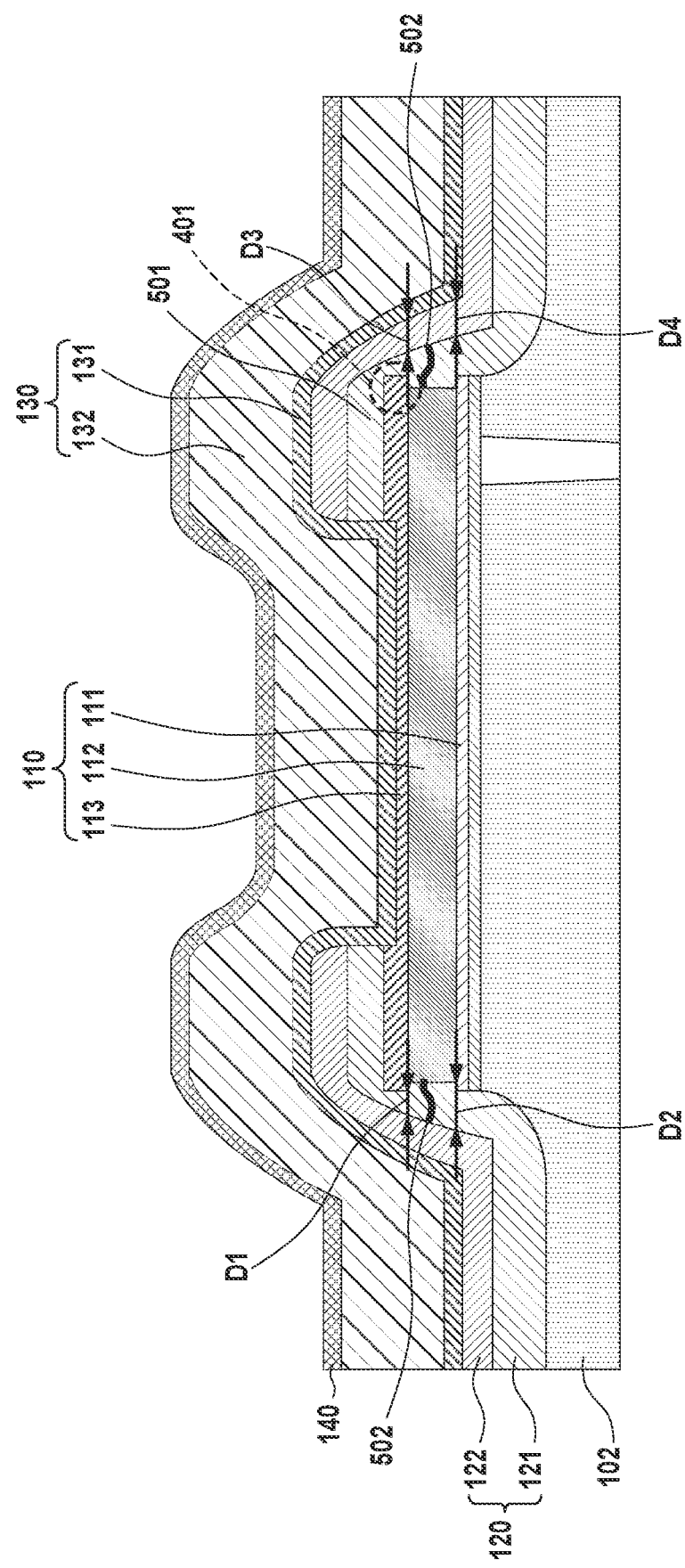
FIG. 4 is an enlarged sectional view showing a part of FIG. 3.
Figure 5A:
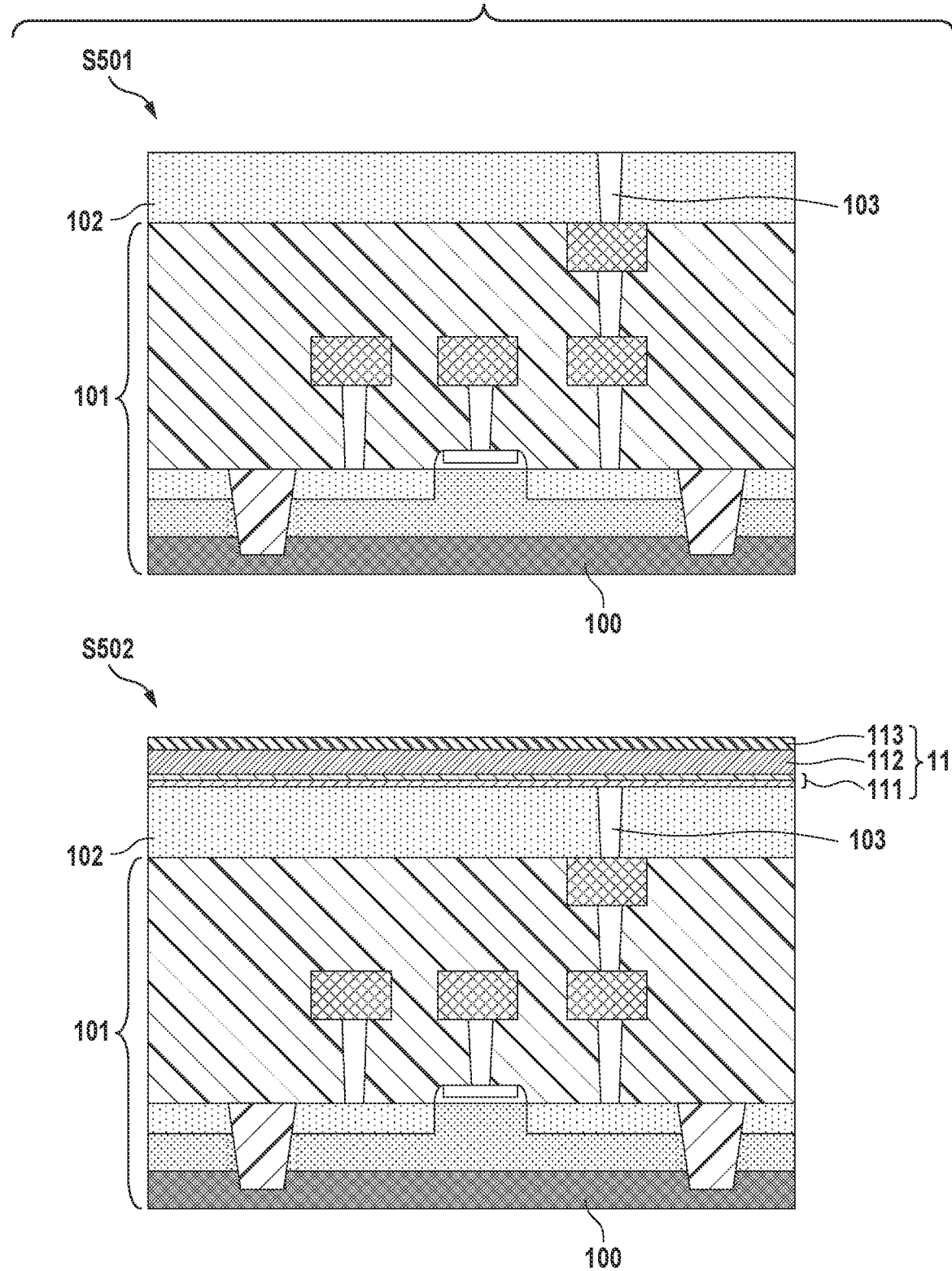
FIG. 5A is a view showing a method of manufacturing the display device according to the first embodiment.
Figure 5B:
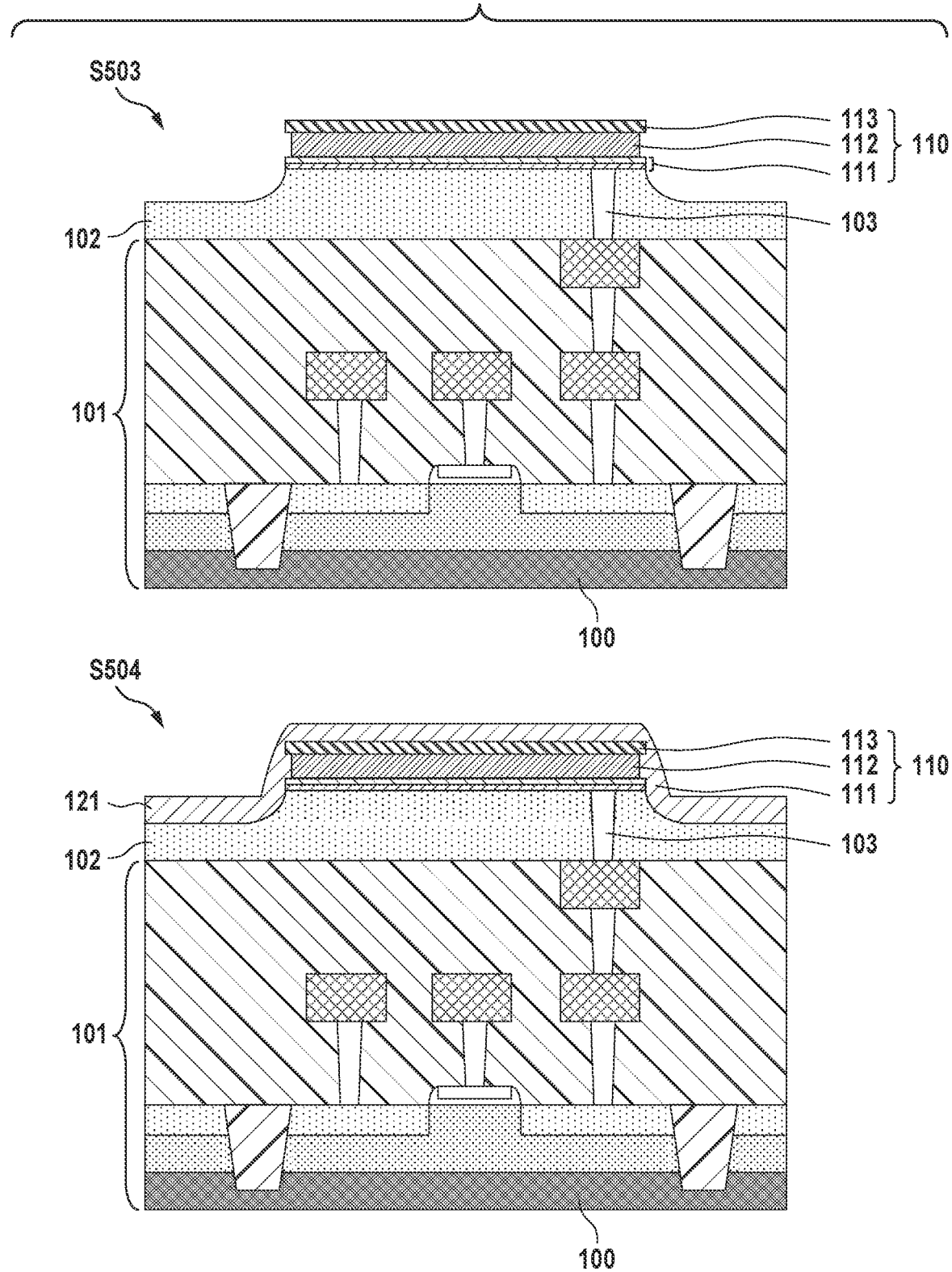
FIG. 5B is a view showing the method of manufacturing the display device according to the first embodiment.
Figure 5C:
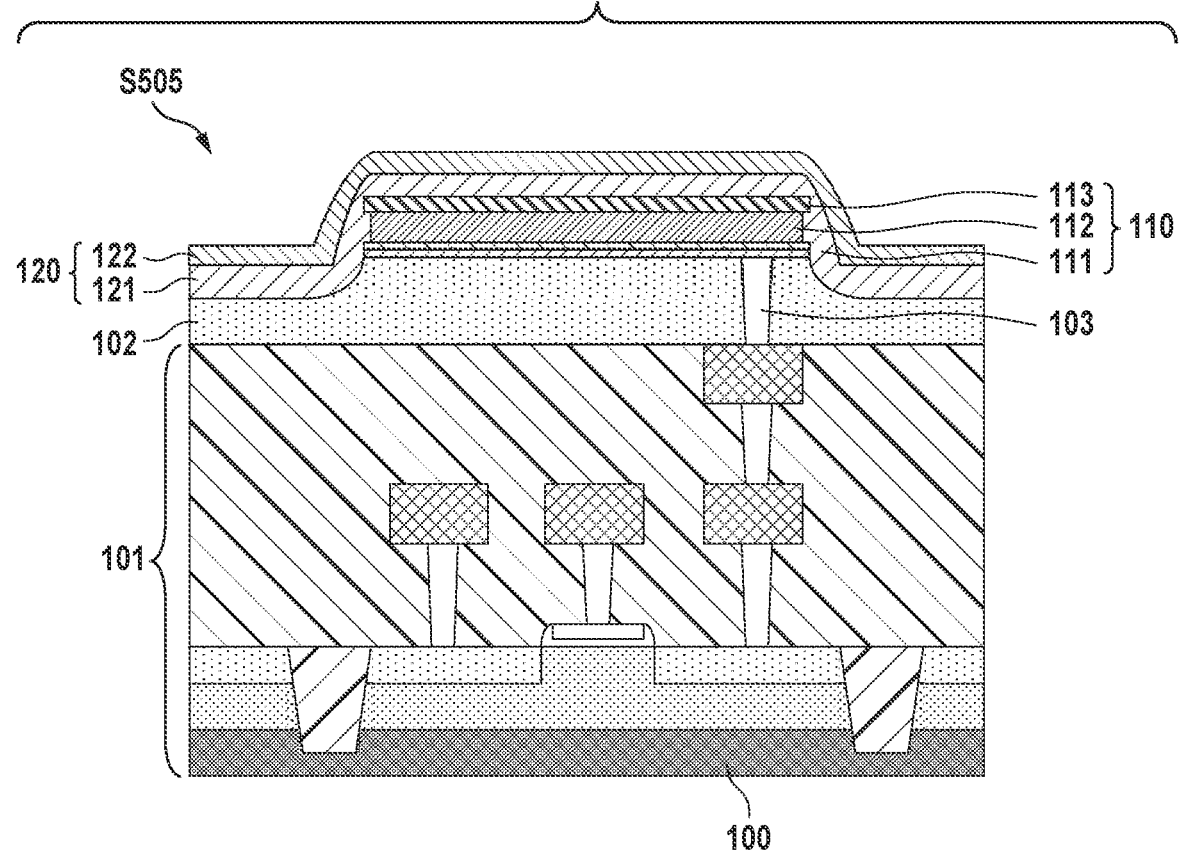
FIG. 5C is a view showing the method of manufacturing the display device according to the first embodiment.
Figure 5C:
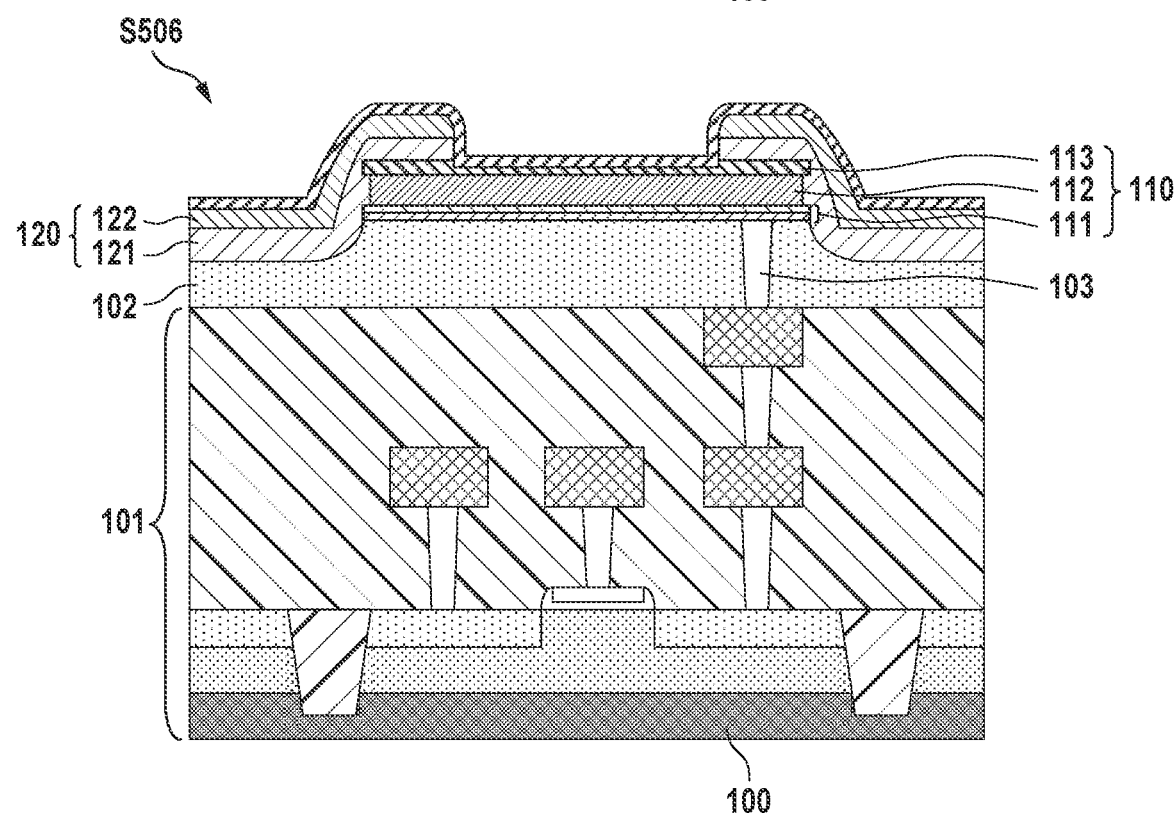
Figure 5D:
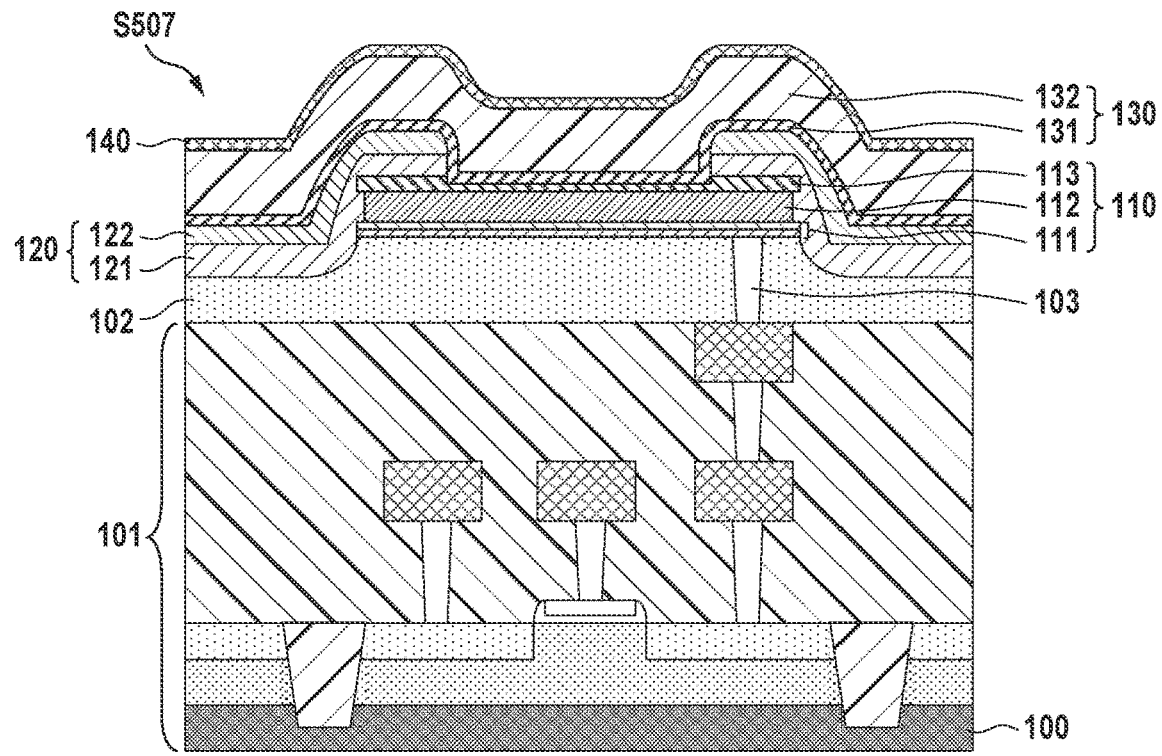
FIG. 5D is a view showing the method of manufacturing the display device according to the first embodiment.
Figure 5D:
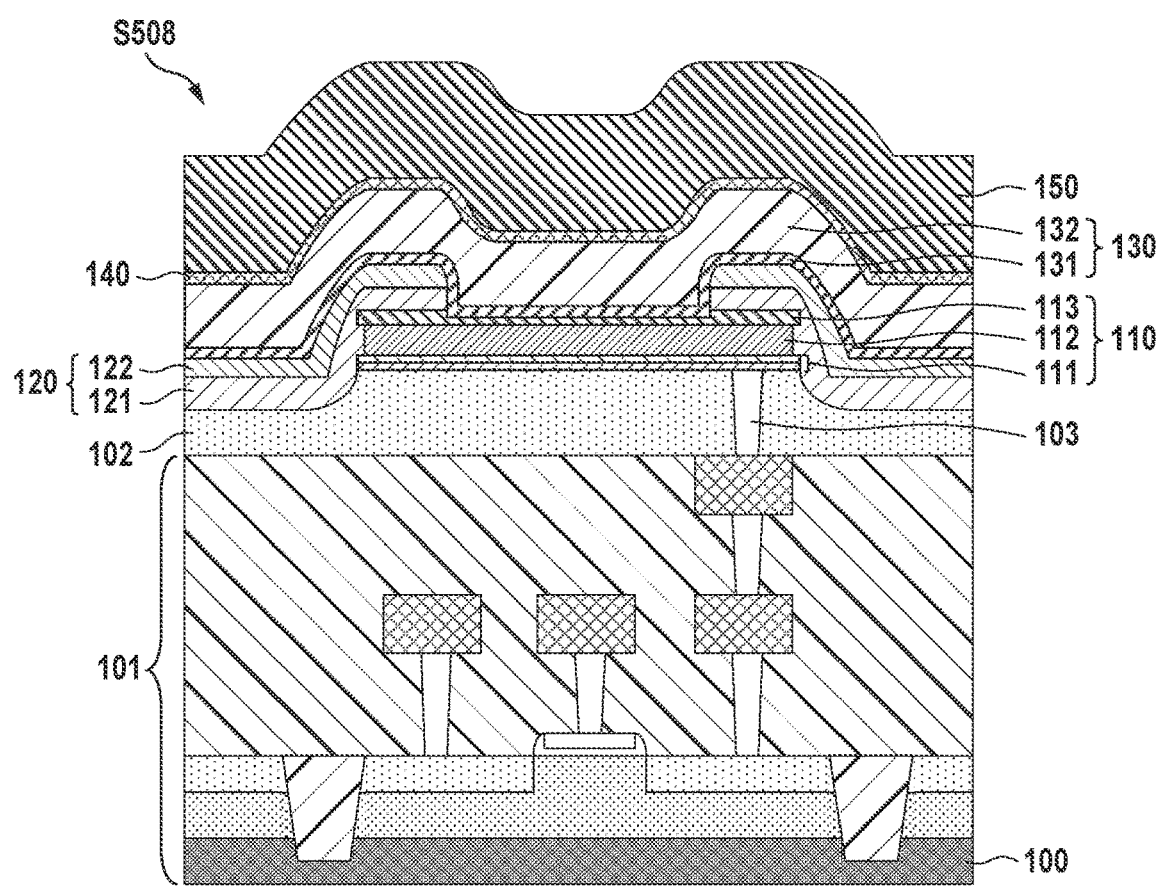
Figure 5E:
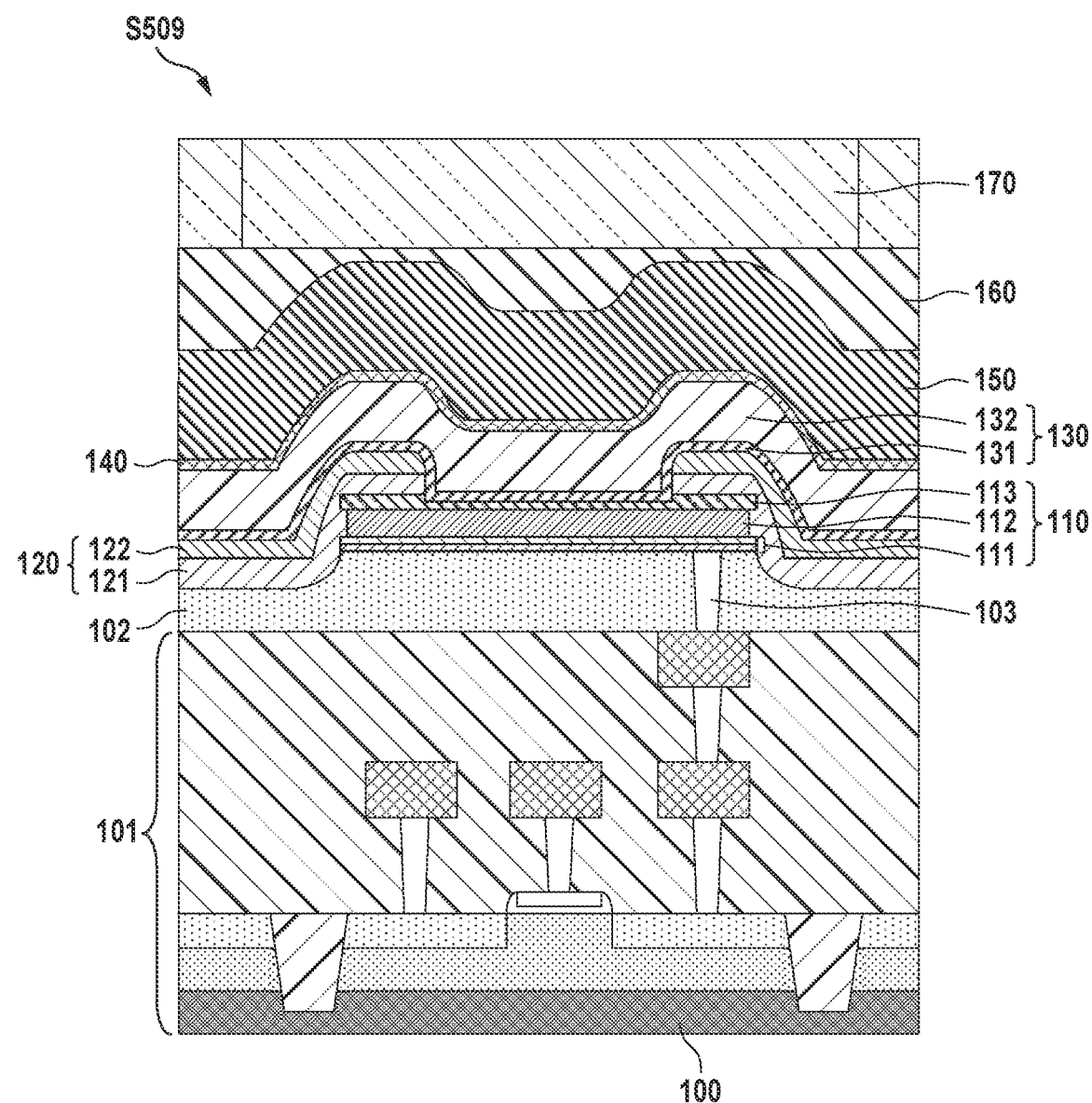
FIG. 5E is a view showing the method of manufacturing the display device according to the first embodiment.

FIG. 4 is an enlarged sectional view showing a part of FIG. 3. Each first electrode 110 can be formed by stacking a plurality of electrically conductive material layers. Each first electrode 110 can be formed so that the side face of at least one of the plurality of electrically conductive material layers protrudes with respect to the side faces of the remaining ones of the plurality of electrically conductive material layers in the planar view with respect to the upper face of the interlayer insulating layer 102. For example, each first electrode 110 is formed by stacking a plurality of electrically conductive material layers such as the barrier metal layer 111, the reflective metal layer 112, and the injection efficiency adjustment layer 113, and the injection efficiency adjustment layer 113 as at least one electrically conductive material layer protrudes with respect to the remaining electrically conductive material layers. This can form an eaves-shaped step 401 on the side face of each first electrode 110. The eaves-shaped step 401 can be formed by a difference in etching rate among the plurality of electrically conductive material layers when forming each first electrode 110 by patterning the plurality of electrically conductive material layers. Alternatively, the eaves-shaped step 401 may be intentionally formed using a difference in etching rate among the plurality of electrically conductive material layers when forming each first electrode 110 by patterning the plurality of electrically conductive material layers. In the example shown in FIG. 4, the injection efficiency adjustment layer 113 protrudes in an eaves shape while covering the upper face of the reflective metal layer 112 completely. This structure is effective to prevent a local abnormality in injection efficiency from occurring when the organic layer 130 locally contacts the reflective metal layer 112.

The first insulating layer 121 is arranged between at least the side faces of the plurality of first electrode 110 and the second insulating layer 122. The first insulating layer 121 can include a first part 501 and a second part 502 (to also be referred to as a low-density part or a defect-containing part hereinafter) having a density (a mass per unit volume) lower than that of the first part 501. The first part 501 can include a part that covers the outer peripheral part of the upper face of each of the plurality of first electrodes 110. The second part 502 can be arranged in a side part of the side face of each of the plurality of first electrodes 110, for example, near the eaves-shaped step 401 (near the injection efficiency adjustment layer 113 forming the step 401). The second part 502 can be arranged between the upper face of the interlayer insulating layer 102 and the injection efficiency adjustment layer 113 forming the step 401.

For example, the second part 502 can be a part including a cavity, a gap, or a defect such as a crack, or can be a defect itself. The second part 502 may form a current path from an undesirable part of the first electrode 110 to the organic layer 130, or allow water to enter the organic layer 130. The second insulating layer 122 is arranged to cover the second part 502 of the first insulating layer 121, thereby suppressing the second part 502 from directly contacting the organic layer 130. The formation of a current path from an undesirable part of the first electrode 110 to the organic layer 130 can be suppressed. If the second part 502 is formed as a large cavity, the absence of the second insulating layer 122 may cause a short circuit between each first electrode 110 and the second electrode 140. However, by providing the second insulating layer 122, such short circuit can be prevented. The second insulating layer 122 is arranged to sufficiently cover the entire region, to be covered, of the first electrode 110.

In the first insulating layer 121, a maximum thickness (a maximum thickness in a direction parallel to the upper face of each first electrode 110) of a part that covers the side face of the electrically conductive material layer (injection efficiency adjustment layer 113) forming the upper face of each first electrode 110 is represented by D1. In the first insulating layer 121, a maximum thickness (a maximum thickness in a direction parallel to the upper face of each first electrode 110) of a part that covers the side face of the reflective metal layer 112 of each first electrode 110 is represented by D2. The injection efficiency adjustment layer 113 is, among the plurality of electrically conductive material layers forming each first electrode 110, the layer forming the upper face of the first electrode 110 and/or the electrically conductive material layer whose side face protrudes most in the planar view with respect to the upper face of the interlayer insulating layer 102. The reflective metal layer 112 is arranged under the injection efficiency adjustment layer 113, and is, among the plurality of electrically conductive material layers forming each first electrode 110, the electrically conductive material layer whose side face is recessed most in the planar view with respect to the upper face of the interlayer insulating layer 102. Furthermore, in the second insulating layer 122, a maximum thickness (a maximum thickness in a direction parallel to the upper face of each first electrode 110) of a part that covers the side face of the electrically conductive material layer (injection efficiency adjustment layer 113) forming the upper face of each first electrode 110 is represented by D3. In the second insulating layer 122, a maximum thickness (a maximum thickness in a direction parallel to the upper face of each first electrode 110) of a part that covers the side face of the reflective metal layer 112 of each first electrode 110 is represented by D4. This definition preferably satisfies D3/D4>D1/D2. D3/D4>D1/D2 indicates that the property of covering the step 401 by the second insulating layer 122 is better than that of covering the step 401 by the first insulating layer 121.

In order for the first insulating layer 121 to have a continuous structure on the side face of the step 401, the thickness (the thickness in a direction perpendicular to the upper face of each first electrode 110) of the first insulating layer 121 on the upper face of each first electrode 110 is preferably larger than that of the injection efficiency adjustment layer 113.

If the organic layer 130 extends not only to the pixel region 20 but also to the peripheral circuit region 40, the second insulating layer 122 preferably extends not only to the pixel region 20 but also along the lower face of the organic layer 130 in the peripheral circuit region 40. This arrangement is effective to prevent water from entering the organic layer 130 in the peripheral circuit region 40 to reach the organic layer 130 in the pixel region 20. If the second electrode 140 extends not only to the pixel region 20 but also to the peripheral circuit region 40, the second insulating layer 122 preferably extends not only to the pixel region 20 but also along the lower face of the second electrode 140 in the peripheral circuit region 40. This arrangement is effective to prevent water from entering the second electrode 140 from below to reach the organic layer 130 in the pixel region 20 via the second electrode 140. A light-transmitting material forming the second electrode 140 generally has a low prevention property.

The third insulating layer (not shown) or more insulating layers may be stacked on the second insulating layer 122. By increasing the number of insulating layers forming the insulating film 120, it is possible to reduce the possibility that the second part 502 contacts the organic layer 130 or the second electrode 140. It is also possible to reduce entrance of water to the organic layer 130. Materials forming the first insulating layer 121, the second insulating layer 122, and the third insulating layer may be the same or different.

The organic layer 130 is provided on the plurality of first electrodes 110 and the insulating film 120 commonly to the plurality of first electrodes 110 (in other words, the plurality of sub-pixels). The organic layer 130 has an arrangement in which the hole injection layer 131, the hole transport layer, the light emitting layer, and the electron transport layer are stacked sequentially from the side of the first electrodes 110. The multilayer including the hole transport layer, the light emitting layer, and the electron transport layer is represented as the multilayer 132.

The second electrode 140 is provided on the organic layer 130 commonly to the plurality of first electrodes 110 (in other words, the plurality of sub-pixels). The second electrode 140 is a light-transmitting electrically conductive film, and can be formed by a single layer made of one of ITO, IZO, ZnO, Ag, and an MgAg alloy or a stacked film including two or more layers each made of one of the above materials. The second electrode 140 can include a plurality of layers made of, for example, lithium fluoride and calcium in consideration of the electron injection performance. The second electrode 140 can be electrically connected to a wiring layer included in the driving circuit layer 101 around the pixel region 20. If the second electrode 140 is thinned to improve the light transmittance of the second electrode 140, the wiring layer included in the driving circuit layer 101 and the second electrode 140 may be electrically connected in the pixel region 20 in consideration of a relatively high sheet resistance of the second electrode 140.

According to the first embodiment, a method of forming the insulating film 120 is not limited to a method of oxidizing the first electrodes 110. Therefore, the first embodiment is advantageous in improving the quality of the insulating film 120 while relaxing the limitation on the material of the first electrodes 110.

The moisture resistant layer 150 is provided on the second electrode 140 commonly to the plurality of first electrodes 110 (in other words, the plurality of sub-pixels). The moisture resistant layer 150 can be formed by, for example, a silicon nitride (SiNx) film having a thickness falling within a range of 0.1 μm to 10 μm. The color filter layers 170 are provided on the moisture resistant layer 150. The color filter layers 170 extract light beams generated by the plurality of sub-pixels as red, green, and blue light beams, respectively. Note that a light shielding portion for suppressing color mixing between the pixels may be provided between color filter patterns each arranged for each light emitting color.

A method of manufacturing the display device 1 according to the first embodiment will be exemplarily described below with reference to FIGS. 5A to 5E. In step S501, the driving circuit layer 101 including circuit elements such as the write transistors Tr1, the driving transistors Tr2, and the holding capacitances Cs is formed. The driving circuit layer 101 can be formed by, for example, a MOS process. Next, the interlayer insulating layer 102 is formed on the driving circuit layer 101. The interlayer insulating layer 102 can be formed by an insulating film such as a silicon oxide film (SiOx) or silicon oxynitride film (SiON). The upper face of the interlayer insulating layer 102 can be planarized by a CMP method or the like. A plurality of connection ports are formed at predetermined positions in the interlayer insulating layer 102 by a photolithography method and a dry etching method, and a film of an electrically conductive material such as tungsten (W) is formed so that the plurality of connection ports are filled with the electrically conductive material. After that, this film is processed by the CMP method or an etch-back method, forming the plugs 103 made of the electrically conductive material.

In step S502, a stacked metal film formed by, for example, a titanium (Ti) film, a titanium nitride (TiN) film, an aluminum alloy film, and a titanium (Ti) film is formed on the interlayer insulating layer 102. The stacked metal film can be formed by, for example, the sputtering method. In step S503, the stacked metal film formed in step S502 is patterned by the photolithography method and dry etching method, forming the first electrodes 110 connected to the plugs 103.

In step S504, an insulating layer such as a silicon oxide film (SiOx), silicon oxynitride film (SiON), or silicon nitride film (SiNx) is formed as the first insulating layer 121 on the first electrodes 110 by, for example, a plasma CVD method. The first insulating layer 121 is preferably formed at a temperature of 400° C. or lower.

In step S505, an insulating layer such as a silicon oxide film (SiOx), silicon oxynitride film (SiON), or silicon nitride film (SiNx) can be formed as the second insulating layer 122 on the first insulating layer 121 by, for example, a high-density plasma CVD method. When the second insulating layer 122 is formed by the high-density plasma CVD method, the inclination of the upper face of the second insulating layer 122 covering the eaves-shaped step 401 of each first electrode 110 can be relaxed using, for example, a sputtering reaction caused by argon (Ar) gas. That is, a step generated on the surface of a part of the second insulating layer 122, that covers the step 401 on the side face of each first electrode 110 is smaller than a step generated on the surface of a part of the first insulating layer 121, that covers the step 401 on the side face of each first electrode 110.

In step S506, the first insulating layer 121 and the second insulating layer 122 are patterned by the photolithography method and dry etching method, forming the insulating film 120 including an opening on each first electrode 110. At this time, connection ports for connecting, to a metal layer that is the same layer as that of the first electrodes 110, the second electrode 140 to be formed in a subsequent step can be formed simultaneously. Next, a cleaning step of cleaning a structure in which the insulating film 120 is formed is performed to remove foreign substances on the surface of the structure. After the cleaning step, a dehydration process can be performed to remove water on the surface of the structure.

In step S507, a plurality of organic layers such as the hole injection layer 131, the hole transport layer, the light emitting layer, and the electron transport layer (the hole transport layer, the light emitting layer, and the electron transport layer are represented as the multilayer 132) can be sequentially formed as the organic layer 130 forming the organic light emitting device by, for example, vacuum deposition. Subsequently, the second electrode 140 can be formed by vacuum deposition without opening from a reduced-pressure atmosphere to the air. When forming the organic layer 130 by vacuum deposition, the organic layer 130 can be selectively formed in a predetermined region using a metal mask. In step S506 described above, the second insulating layer 122 is preferably formed to include the region where the organic layer 130 is to be formed.

In step S508, the moisture resistant layer 150 is formed to cover the second electrode 140 by, for example, a film formation method such as a plasma CVD method, a sputtering method, or an ALD method, or a combination thereof. The film formation temperature of the moisture resistant layer 150 can be set to a temperature equal to or lower than the temperature of decomposition of the organic material forming the organic layer 130, for example, 120° C.

In step S509, the moisture resistant layer 150 can be coated with a material of a red filter, and patterning is performed by the photolithography method, forming the red filter. Subsequently, similarly to the red filter, a green filter and a blue filter are sequentially formed, forming the color filter layers 170. A processing temperature in the step of forming the color filter layers 170 can be set to a temperature equal to or lower than the temperature of decomposition of the organic material forming the organic layer 130, for example, 120° C. Next, a terminal extraction pad portion in the display device 1 is formed by the photolithography method and the dry etching method.

Figure 6A:
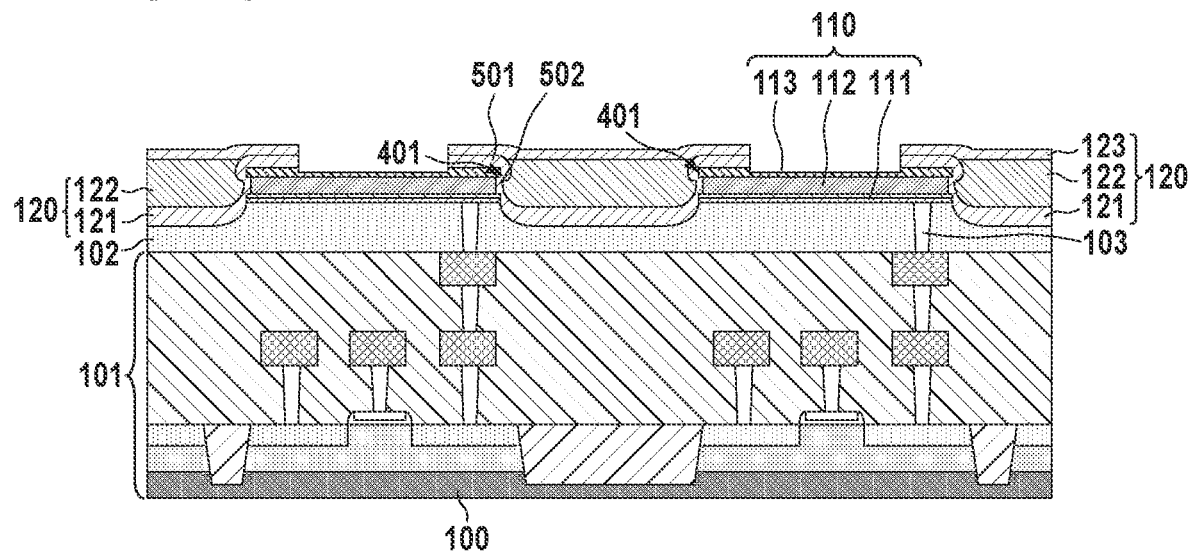
FIG. 6A is a view schematically showing the sectional structure of a display device according to the second embodiment.
Figure 6B:
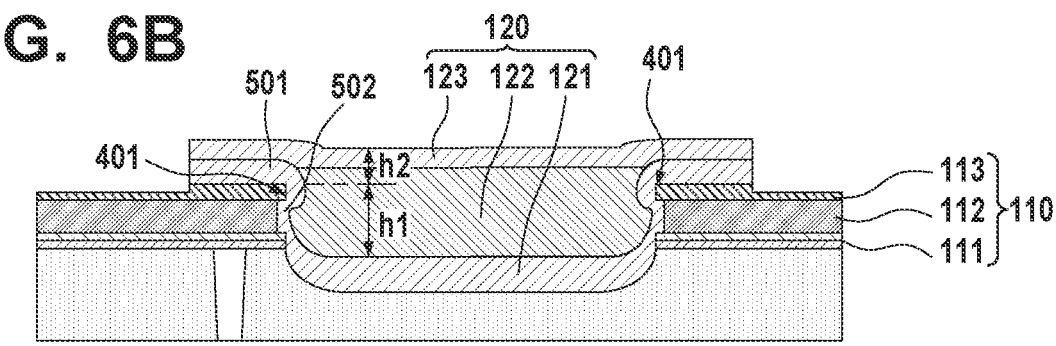
FIG. 6B is a view schematically showing the sectional structure of a display device according to the second embodiment.
Figure 7A:
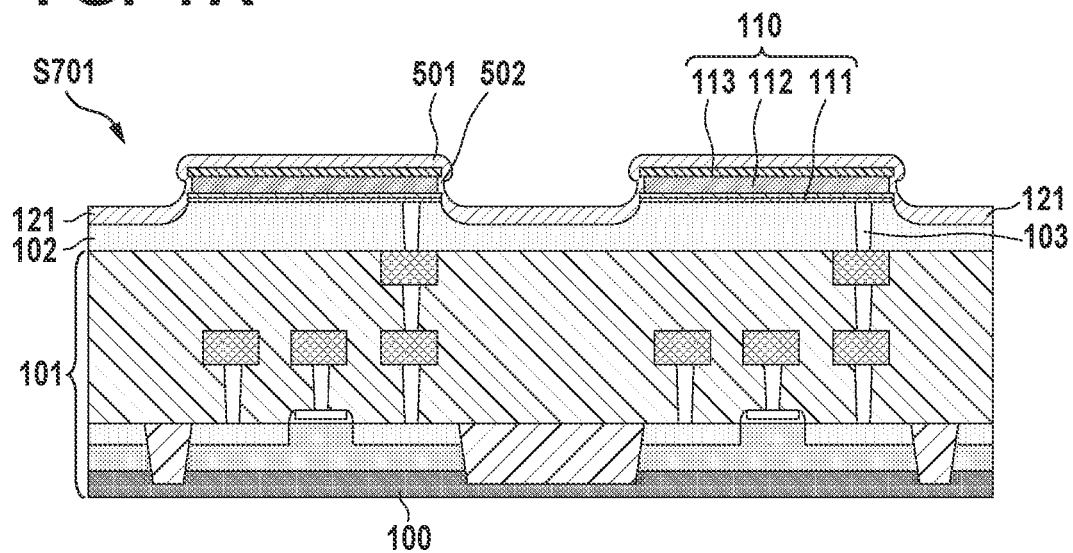
FIG. 7A is a view showing a method of manufacturing the display device according to the second embodiment.
Figure 7B:
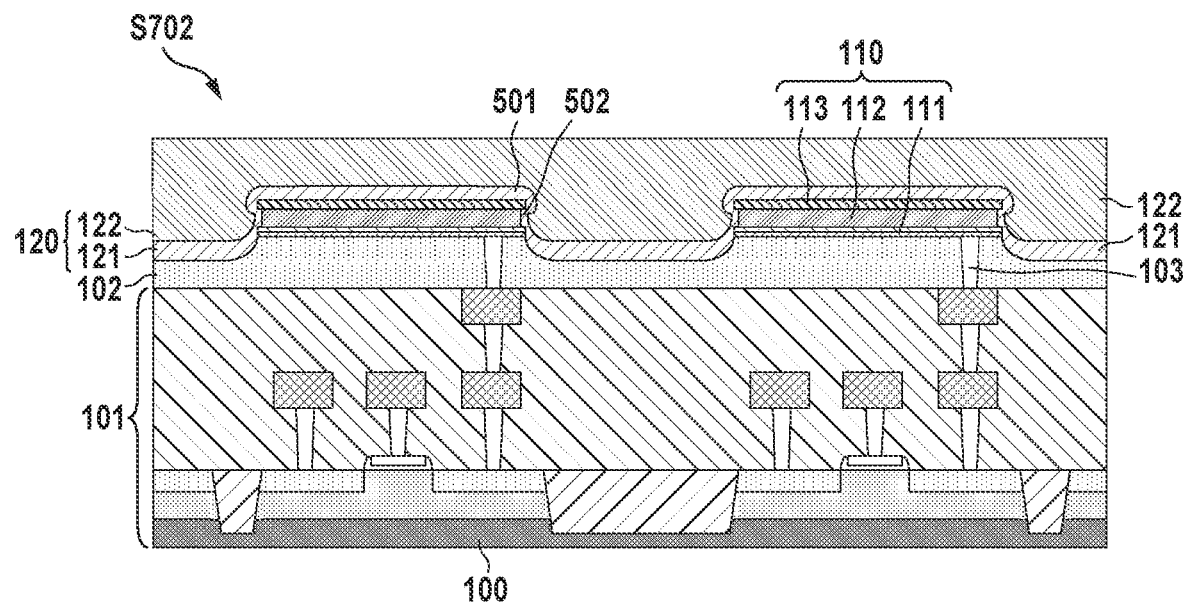
FIG. 7B is a view showing the method of manufacturing the display device according to the second embodiment.
Figure 7C:
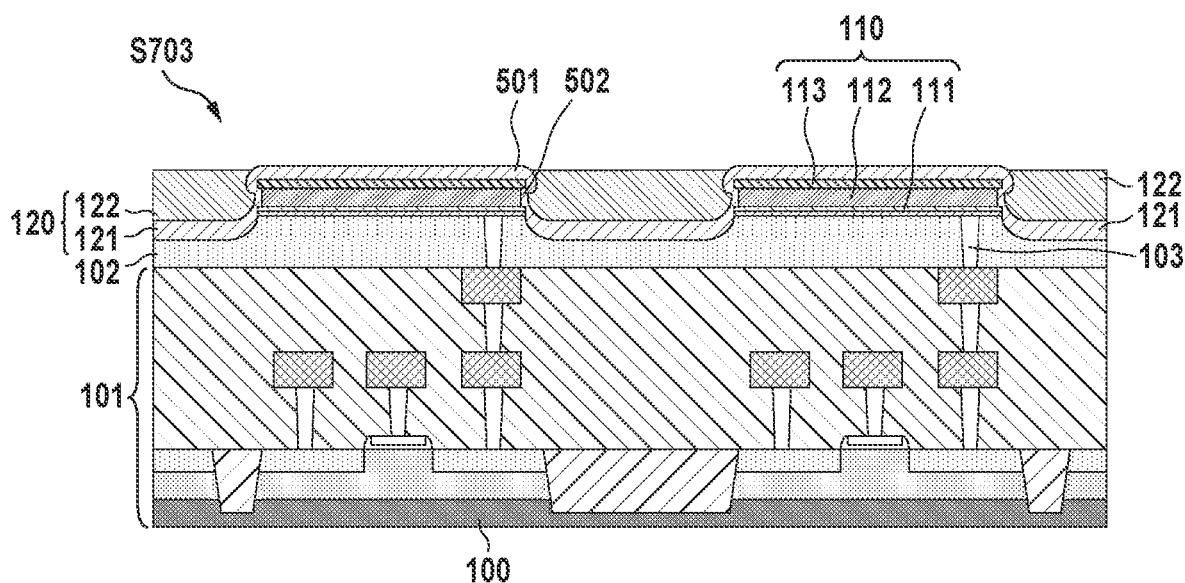
FIG. 7C is a view showing the method of manufacturing the display device according to the second embodiment.
Figure 7D:
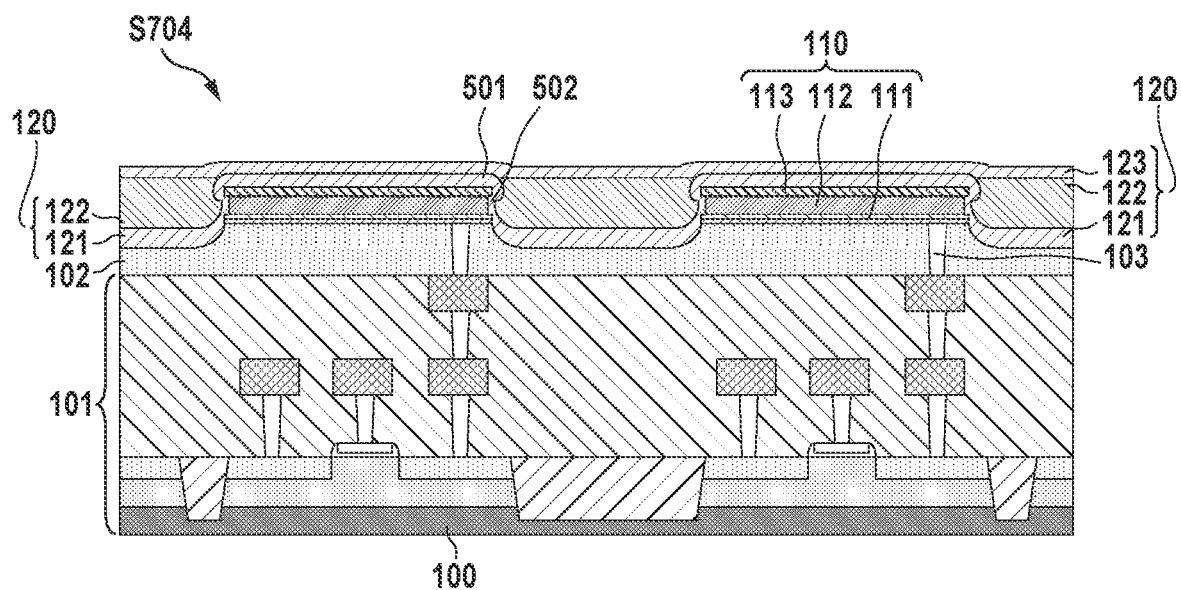
FIG. 7D is a view showing the method of manufacturing the display device according to the second embodiment.
Figure 7E:
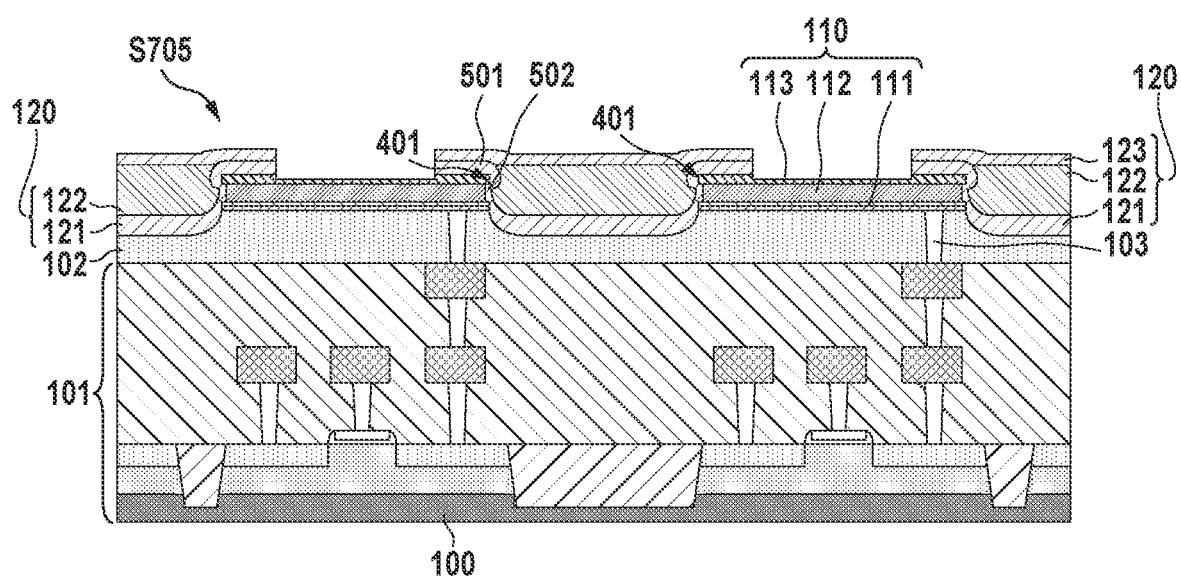
FIG. 7E is a view showing the method of manufacturing the display device according to the second embodiment.

A display device 1 according to the second embodiment of the present invention will be described below with reference to FIGS. 6A, 6B, and 7A to 7E. Note that matters which are not mentioned as the second embodiment can comply with the first embodiment. In FIG. 6A schematically shows a sectional structure taken along a line C-C' in FIG. 2, and FIG. 6B is an enlarged view showing a part of FIG. 6A. In the second embodiment, a second insulating layer 122 is arranged so as to fill a space between adjacent first electrodes 110 and cover a second part 502 (to also be referred to as a low-density part or a defect-containing part hereinafter) of a first insulating layer 121. The second insulating layer 122 also has a function of planarizing the surface of an insulating film 120. The insulating film 120 can include a third insulating layer 123 that covers the first insulating layer 121 and the second insulating layer 122. The third insulating layer 123 preferably has a moisture resistance and/or insulating property higher than that of the second insulating layer 122. Similarly to the first embodiment, an organic layer 130 is arranged on the first electrodes 110 and the third insulating layer 123 (insulating film 120). An opening defining a light emitting region is formed in the first insulating layer 121 and the third insulating layer 123 (insulating film 120).

In the arrangement shown in FIGS. 6A and 6B, the second insulating layer 122 is arranged to be surrounded as a whole by the first insulating layer 121 and the third insulating layer 123. Instead of this arrangement, the second insulating layer 122 may be arranged so as to partially contact the upper faces of the first electrodes 110 and to be surrounded by the upper faces of the first electrodes 110, the first insulating layer 121, and the third insulating layer 123.

Details of the respective components will be exemplarily described below. The first electrodes 110 are electrically isolated for each sub-pixel. The first electrode 110 also functions as a reflective layer. It is possible to improve the light emitting efficiency of a light emitting device EL by improving the reflectance of each first electrode 110. The thickness of each first electrode 110 can fall within a range of, for example, 30 nm to 1,000 nm. The interval between the first electrodes 110 arranged adjacent to each other can fall within a range of, for example, 100 nm to 1,000 nm. When h1 represents the maximum height difference between the upper face of each first electrode 110 and that of the first insulating layer 121 and h2 represents the maximum height difference between the upper face of each first electrode 110 and that of the second insulating layer 122, h1>h2 can be satisfied.

The upper face of the interlayer insulating layer 102 between the adjacent first electrodes 110 can have a concave shape. The first insulating layer 121 can be arranged to cover the side faces of the patterned first electrodes 110 while covering the concave-shaped upper face of the interlayer insulating layer 102 between the adjacent first electrodes 110. The first insulating layer 121 can have a thickness falling within a range of, for example, 1 nm to 100 nm. The first insulating layer 121 can be made of, for example, an organic material such as acryl or polyimide or an inorganic material such as silicon oxide (SiOx), silicon nitride (SiNx), or silicon oxynitride (SiON). The first insulating layer 121 is preferably made of a material having a low moisture content so the organic layer 130 does not deteriorate due to water.

The second insulating layer 122 can be made of, for example, an organic material such as acryl or polyimide or an SOG (Spin On Glass) material as a coating type glass material. One of materials having low moisture contents is preferably selected for the second insulating layer 122 so the organic layer 130 does not deteriorate due to the influence of water. The second insulating layer 122 may be made of an inorganic material such as silicon oxide (SiOx), silicon nitride (SiNx), or silicon oxynitride (SiON). The second insulating layer 122 may be made of a photosensitive material.

The third insulating layer 123 can be arranged to contact the first insulating layer 121 on the first electrodes 110 and cover the upper face of the second insulating layer 122 arranged between the adjacent first electrodes 110. The third insulating layer 123 can have a thickness falling within a range of 1 nm to 100 nm. The third insulating layer 123 can be made of, for example, an organic material such as acryl or polyimide or an inorganic material such as silicon oxide (SiOx), silicon nitride (SiNx), or silicon oxynitride (SiON). The third insulating layer 123 is preferably made of a material having a low moisture content so the organic layer 130 does not deteriorate due to the influence of water. The third insulating layer 123 is preferably made of a material having a high moisture resistance, as compared to the second insulating layer 122. The third insulating layer 123 is formed using, as an underlayer, the surface planarized by the second insulating layer 122, and can thus be formed not to have a part with a density lower than that of the first insulating layer 121. Therefore, the third insulating layer 123 has a moisture resistance higher than that of the first insulating layer 121, and provides a high effect of suppressing current leakage. The first insulating layer 121, the second insulating layer 122, and the third insulating layer 123 can be arranged so the second insulating layer 122 does not contact the organic layer 130 and a second electrode 140.

A method of manufacturing the display device 1 according to the second embodiment will be exemplarily described below with reference to FIGS. 7A to 7E. Note that a description of parts common to the method of manufacturing the display device 1 according to the first embodiment will be omitted. After forming the first electrodes 110, in step S701 an insulating layer such as a silicon oxide film (SiOx), silicon oxynitride film (SiON), or silicon nitride film (SiNx) is formed as the first insulating layer 121 on the first electrodes 110 by, for example, the plasma CVD method. The first insulating layer 121 is preferably formed at a temperature of 400° C. or lower.

In step S702, the second insulating layer 122 is formed on the first insulating layer 121. The second insulating layer 122 can be formed by, for example, coating the first insulating layer 121 with an SOG film by spin coating or slit coating to fill each concave part between adjacent first electrodes 110 with the SOG film. Since the underlayer of the SOG film is the surface of the first insulating layer 121, it is possible to form the SOG film by suppressing a defect such as a defect (void) in a film or unevenness in wetting at the time of coating. In order to surely cover the undulations of the first insulating layer 121 along the side faces of the first electrodes 110, the SOG film preferably has a thickness that can sufficiently cover the first insulating layer 121 on the first electrodes 110.

In step S703, the SOG film is partially removed by etch back so that the first insulating layer 121 on each first electrode 110 is exposed, and the remaining SOG film forms the second insulating layer 122. The second insulating layer 122 planarizes the region between the adjacent first electrodes 110. The second insulating layer 122 may be formed by a film other than the SOG film. If the second insulating layer 122 is formed between the first electrodes 110 by the above method, the second insulating layer 122 is preferably made of a material having a large etching selectivity with respect to the first insulating layer 121.

The second insulating layer 122 may be made of a photosensitive organic material (acryl or polyimide described above). In this case, the second insulating layer 122 can be formed at a predetermined position by the photolithography method. The second insulating layer 122 may be formed by a printing method. Alternatively, the second insulating layer 122 may be formed by a combination of the photolithography method and etching method. Chemical polishing (CMP method) may be applied for planarization.

To suppress water contained in the second insulating layer 122 from reaching the organic layer 130 via some route, a dehydration process for removing water contained in the second insulating layer 122 is preferably performed. The dehydration process and film formation of the second insulating layer 122 are preferably performed at a temperature of 400° C. or lower.

In step S704, an insulating layer such as a silicon oxide film (SiOx), silicon oxynitride film (SiON), or silicon nitride film (SiNx) is formed as the third insulating layer 123 on the first insulating layer 121 and the second insulating layer 122 by the plasma CVD method. The third insulating layer 123 is preferably formed at a temperature of 400° C. or lower.

In step S705, the first insulating layer 121 and the third insulating layer 123 are patterned by the photolithography method and dry etching method, forming the insulating film 120 including an opening on each first electrode 110. At this time, connection ports for connecting, to a metal layer that is the same layer as that of the first electrodes 110, the second electrode 140 to be formed in a subsequent step can be formed simultaneously. Subsequent steps are the same as in the first embodiment.

In the second embodiment, if the first insulating layer 121 covering the side face of each first electrode 110 includes a concave part between the first electrodes 110, the second insulating layer 122 forms a planarized surface on each first electrode 110. The first insulating layer 121 and the second insulating layer 122 can be covered with the third insulating layer 123. With this process, a second part (to also be referred to as a low-density part or a defect-containing part hereinafter) 502 of the first insulating layer 121, that is formed near a step 401, is covered with the second insulating layer 122 and can also be covered with the third insulating layer 123. This arrangement suppresses formation of a current path from the first electrode 110 to the organic layer 130 via the second part 502 of the first insulating layer 121 and entrance of water to the organic layer 130.

Figure 8:
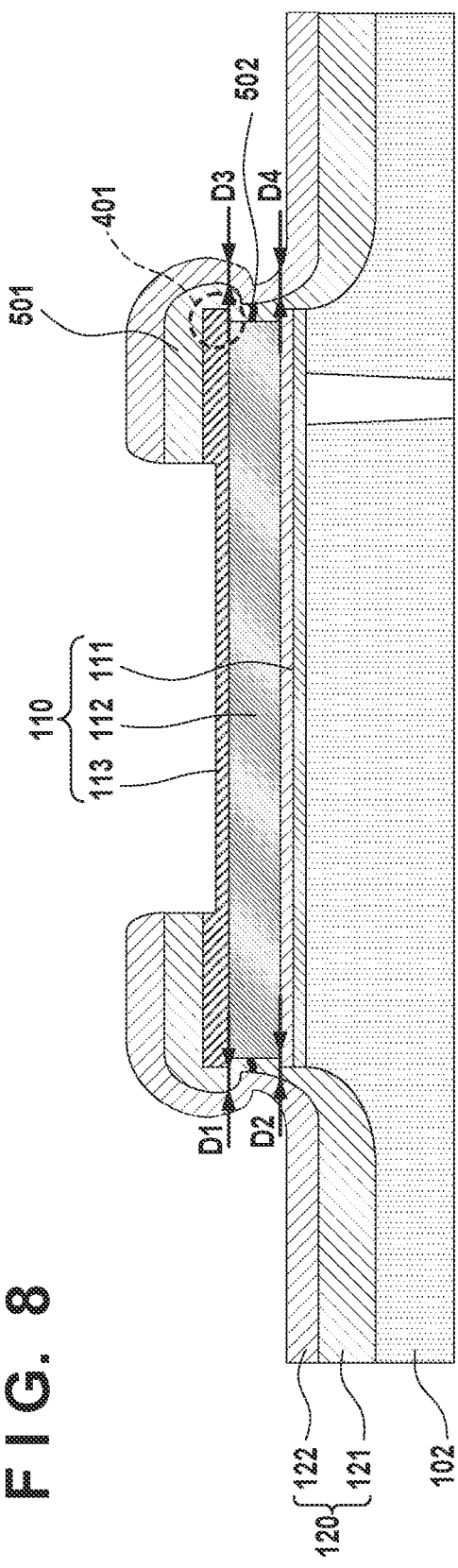
FIG. 8 is a view schematically showing the sectional structure of a display device according to the third embodiment.

A display device 1 according to the third embodiment of the present invention will be described below with reference to FIG. 8. Note that matters which are not mentioned as the third embodiment can comply with the first embodiment. FIG. 8 schematically shows a sectional structure taken along a line A-A' in FIG. 2. In the third embodiment, as schematically shown in FIG. 8, a first insulating layer 121 and a second insulating layer 122 forming an insulating film 120 have an overhang shape along a step 401. An organic layer 130 is arranged on the second insulating layer 122.

In the first insulating layer 121, a maximum thickness (a maximum thickness in a direction parallel to the upper face of each first electrode 110) of a part that covers the side face of the electrically conductive material layer (injection efficiency adjustment layer 113) forming the upper face of each first electrode 110 is represented by D1. In the first insulating layer 121, a maximum thickness (a maximum thickness in a direction parallel to the upper face of each first electrode 110) of a part that covers the side face of a reflective metal layer 112 of each first electrode 110 is represented by D2. The injection efficiency adjustment layer 113 is, among the plurality of electrically conductive material layers forming the first electrode 110, the layer forming the upper face of the first electrode 110 and/or the electrically conductive material layer whose side face protrudes most. The reflective metal layer 112 is arranged under the injection efficiency adjustment layer 113, and is, among the plurality of electrically conductive material layers forming each first electrode 110, the electrically conductive material layer whose side face is recessed most. Furthermore, in the second insulating layer 122, a maximum thickness (a maximum thickness in a direction parallel to the upper face of each first electrode 110) of a part that covers the side face of the electrically conductive material layer (injection efficiency adjustment layer 113) forming the upper face of each first electrode 110 is represented by D3. In the second insulating layer 122, a maximum thickness (a maximum thickness in a direction parallel to the upper face of each first electrode 110) of a part that covers the side face of the reflective metal layer 112 of each first electrode 110 is represented by D4. This definition preferably satisfies D3/D4>D1/D2. D3/D4>D1/D2 indicates that the property of covering the step 401 by the second insulating layer 122 is better than that of covering the step 401 by the first insulating layer 121.

In the third embodiment, the first insulating layer 121 and the second insulating layer 122 forming the insulating film 120 have an overhang shape along the step 401. Therefore, the surface area of the organic layer 130 arranged to cover the second insulating layer 122 between the adjacent first electrodes 110 can be made larger than that in the first embodiment. According to the third embodiment, therefore, the resistance of the organic layer 130 between the adjacent first electrodes 110 can be made higher than that in the first embodiment, and a leakage current flowing through the organic layer 130 between the adjacent first electrodes 110 can be reduced.

If the thickness of the organic layer 130 falls within a range of 10 nm to 50 nm, the sum of the thickness of the first insulating layer 121 and that of the second insulating layer 122 preferably falls within a range of 20 nm to 200 nm. The second insulating layer 122 preferably has a moisture resistance or insulating property higher than that of the first insulating layer 121.

The third insulating layer (not shown) or more insulating layers may be stacked on the second insulating layer 122. By increasing the number of insulating layers forming the insulating film 120, it is possible to reduce the possibility that the second part 502 contacts the organic layer 130 or a second electrode 140. It is also possible to reduce entrance of water to the organic layer 130. Materials forming the first insulating layer 121, the second insulating layer 122, and the third insulating layer may be the same or different.

A method of manufacturing the display device 1 according to the third embodiment will be exemplarily described below. Note that a description of parts common to the method of manufacturing the display device 1 according to the first embodiment will be omitted. After forming the first electrodes 110, an insulating layer such as a silicon oxide film (SiOx), silicon oxynitride film (SiON), or silicon nitride film (SiNx) is formed as the first insulating layer 121 on the first electrodes 110 by, for example, the plasma CVD method. The first insulating layer 121 is preferably formed at a temperature of 400° C. or lower.

The second insulating layer 122 is formed on the first insulating layer 121. The second insulating layer 122 can be formed by, for example, an ALD (Atomic Layer Deposition) method. The second insulating layer 122 can be formed by, for example, a silicon oxide film (SiOx), silicon oxynitride film (SiON), or silicon nitride film (SiNx). By the ALD method, the second insulating layer 122 having a uniform thickness can be formed. The second insulating layer 122 is preferably formed at a temperature of 400° C. or lower.

When a film is formed by the ALD method or at a temperature of 400° C. or lower, it may be necessary to consider that a film formation rate is low. Therefore, when the first insulating layer 121 and the second insulating layer 122 form the insulating film 120, it is advantageous to make the thickness of the first insulating layer 121 larger than that of the second insulating layer 122 in terms of a short tact time.

Next, the first insulating layer 121 and the second insulating layer 122 are patterned by the photolithography method and dry etching method, forming the insulating film 120 having an opening on each first electrode 110. At this time, connection ports for connecting, to a metal layer that is the same layer as that of the first electrodes 110, the second electrode 140 to be formed in a subsequent step can be formed simultaneously. Subsequent steps are the same as in the first embodiment.

Figure 9:
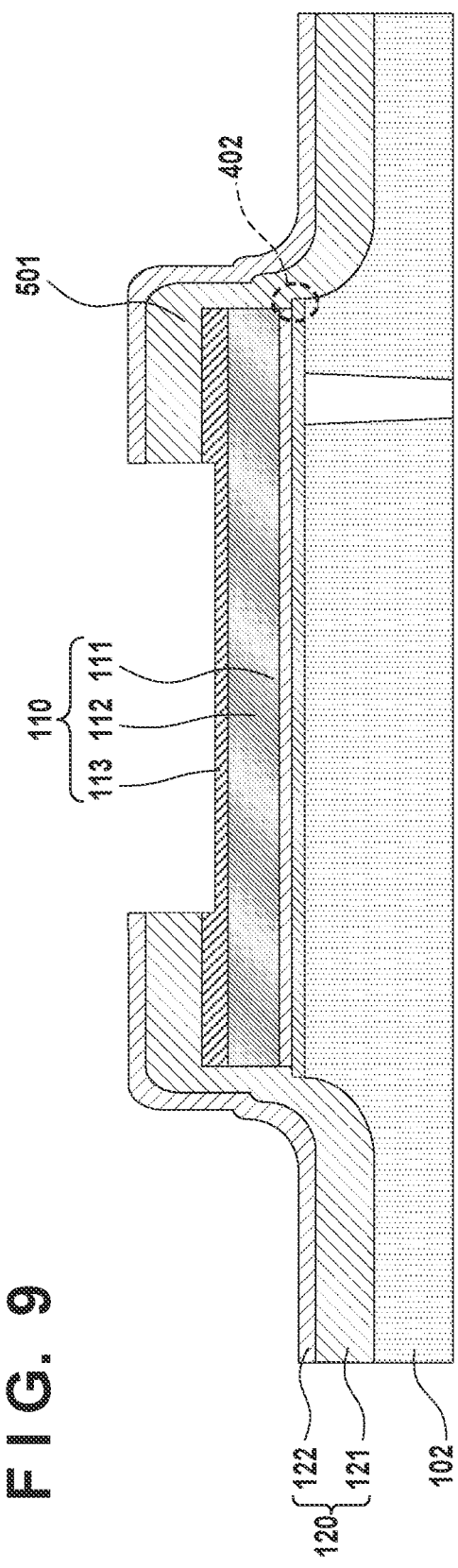
FIG. 9 is a view schematically showing the sectional structure of a display device according to the fourth embodiment.

A display device 1 according to the fourth embodiment of the present invention will be described with reference to FIG. 9. Note that matters which are not mentioned as the fourth embodiment can comply with the first embodiment. FIG. 9 schematically shows a sectional structure taken along a line A-A' in FIG. 2. The display device 1 according to the fourth embodiment includes no eaves-shaped step 401 but includes a step 402 in a barrier metal layer 111.

A first insulating layer 121 preferably has a humidity resistance higher than that of a second insulating layer 122. In addition, the first insulating layer 121 preferably has a humidity resistance higher than that of an interlayer insulating layer 102 under itself. This can delay or suppress entrance of water from the interlayer insulating layer 102 to an organic layer 130. The first insulating layer 121 can be made of, for example, silicon nitride, and the second insulating layer 122 can be made of, for example, silicon oxide or silicon oxynitride. The interlayer insulating layer 102 can be made of silicon oxide or silicon oxynitride.

In the fourth embodiment as well, the first insulating layer 121 can include a first part 501 and a second part (to also be referred to as a low-density part or a defect-containing part hereinafter) 502 having a density lower than that of the first part 501. The second part 502 can be formed near the step 402.

The second part 502 can be generated by a distortion stress generated by the step 402 near the step 402 in the first insulating layer 121. For example, as a result of releasing the distortion stress due to a process of manufacturing the display device 1 or a change in environmental temperature thereafter, the density of the first insulating layer 121 locally decreases, and this part can be the second part 502.

The second insulating layer 122 covers the second part 502 of the first insulating layer 121. The third insulating layer or more insulating layers may be stacked on the second insulating layer 122. By increasing the number of insulating layers forming the insulating film 120, it is possible to reduce the possibility that the second part 502 contacts the organic layer 130 or a second electrode 140. It is also possible to reduce entrance of water to the organic layer 130. Materials forming the first insulating layer 121, the second insulating layer 122, and the third insulating layer may be the same or different.

Figure 10:
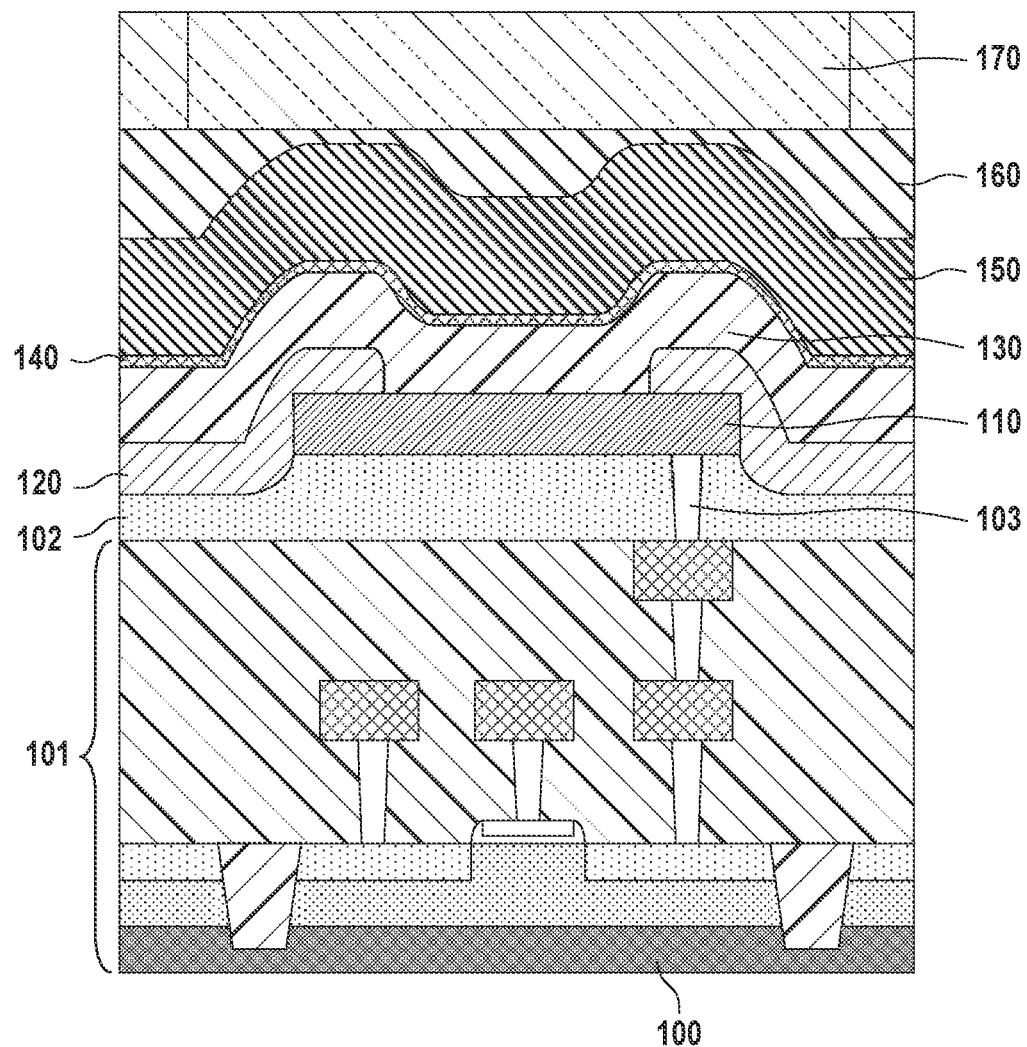
FIG. 10 is a view schematically showing the sectional structure of a display device according to the fifth embodiment.

The fifth embodiment of the present invention will be described below. Note that matters which are not mentioned as the fifth embodiment can comply with the first embodiment. FIG. 10 schematically shows a sectional structure taken along a line A-A' in FIG. 2. Among the components of each sub-pixel 21, a write transistor Tr1, driving transistor Tr2, and holding capacitance Cs for driving a light emitting device EL form a driving circuit, and are arranged in a driving circuit layer 101. In the driving circuit layer 101, a light-shielding layer that blocks stray light entering the write transistor Tr1 and the driving transistor Tr2 can be arranged. The driving circuit layer 101 may include a semiconductor substrate 100, and the active regions of the write transistor Tr1 and driving transistor Tr2 can be formed in the semiconductor substrate 100. Alternatively, the write transistor Tr1 and the driving transistor Tr2 can be formed on an insulating substrate such as a glass substrate.

An interlayer insulating layer 102 is arranged on the driving circuit layer 101, and the light emitting device EL of an R sub-pixel PR, G sub-pixel PG, or B sub-pixel PB is arranged on the interlayer insulating layer 102. A display device 1 can include a plurality of first electrodes (anodes) 110, an insulating film 120 that covers at least the side face of each of the plurality of first electrodes 110, and an organic layer 130 arranged on the plurality of first electrodes 110 and the insulating film 120. The display device 1 can include a second electrode (cathode) 140 arranged on the organic layer 130. Each organic light emitting device EL is formed by the first electrode 110, the organic layer 130, and the second electrode 140. The plurality of organic light emitting devices EL are separated by the insulating film 120. The second electrode 140 can be provided commonly to the plurality of light emitting devices EL. A moisture resistant layer 150, a planarization layer 160, and color filter layers 170 can be arranged on the light emitting devices EL.

The fifth embodiment has a feature in a method of forming the insulating film 120. The insulating film 120 can be made of, for example, silicon oxide formed by the high-density plasma CVD method. In the method of forming the insulating film 120 by the high-density plasma CVD method, for example, $SiH_4$ and $O_2$ as source gases are decomposed by plasma, and the insulating film 120 can be formed under a condition that a deposition action and a sputtering action compete with each other. The sputtering action is caused when, for example, bias power is supplied to a bias electrode provided in a substrate holder that supports a target (a structure (substrate) including the driving circuit layer 101, the interlayer insulating layer 102, and the first electrodes 110) on which the insulating film 120 is to be formed. This bias power causes Ar ions to collide against the insulating film 120 being formed, thereby causing sputtering of the insulating film 120 being formed.

The above-described high-density plasma CVD method is advantageous in forming the high-quality insulating film 120 even if a space between the adjacent first electrodes 110 is narrow. However, in the high-density plasma CVD method, in the early stage of a process of forming the insulating film 120 on the first electrodes 110, the surface of each first electrode 110 is sputtered by Ar ions, thereby roughening the surface of each first electrode 110. If the surface of each first electrode 110 is roughened, the reflectance of the surface of each first electrode 110 may decrease. The upper face of each first electrode 110 may be roughened when the temperature on the upper face of the first electrode 110 suddenly rises due to collision of Ar ions against the surface of the first electrode 110 and the upper face of the first electrode 110 is deformed due to the temperature. However, after the insulating film 120 having a thickness to same extent is formed on the upper faces of the first electrodes 110, a tendency that the upper face of each first electrode 110 is hardly roughened is observed.

It is thus estimated that the deformation of the upper face of each first electrode 110 caused by heat is suppressed by the insulating film 120 covering the upper face of the first electrode 110. If the upper face of each first electrode 110 is largely roughened by heat, a decrease in reflectance of the upper face of the first electrode 110 is not negligible. The reflectance indicates a reflectance with respect to a wavelength in a visible light region. To suppress a decrease in reflectance, for example, the maximum height difference of the upper face of each first electrode 110 is preferably set to 50 nm or smaller, and more preferably, 20 nm or smaller. An allowable value of the roughness of the upper face of each first electrode 110 can change in accordance with a reflectance required for the first electrode 110.

Figure 11:
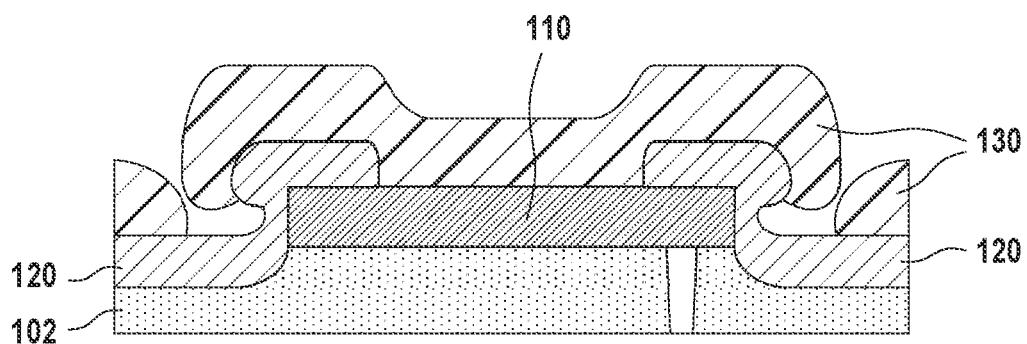
FIG. 11 is a view for explaining a problem.

In a step of forming a part of the insulating film 120, that contacts at least the upper face of each first electrode 110, that is, an early stage of formation of the insulating film 120, the sputtering action is effectively limited not to roughen the surface of each first electrode 110. However, if the insulating film 120 is formed under the condition that the sputtering action is limited, a part of the insulating film 120, that corresponds to the side face of each first electrode 110, overhangs and the organic layer 130 may become discontinuous in this part, as exemplified in FIG. 11. The second electrode 140 formed on the organic layer 130 may also become discontinuous. If the overhang of the insulating film 120 on the side face of each first electrode 110 becomes excessive, the insulating film 120 may also become discontinuous, and each first electrode 110 and the second electrode 140 may be short-circuited.

To solve the above problem, in the fifth embodiment, the step of forming the insulating film 120 includes the first step, and the second step performed after the first step. In the first step, a part of the insulating film 120 is formed under the first condition that the deposition action and the sputtering action compete with each other. In the second step, another part of the insulating film 120 is formed under the second condition that the deposition action and the sputtering action compete with each other. The sputtering action under the first condition is weaker than that under the second condition. Thus, as exemplified in FIG. 12, the upper face of the insulating film 120 near the side face of each first electrode 110 can be moderated to form the insulating film 120 in a continuous shape. Transition from the first step to the second step can be done moderately or stepwise.

Figure 14A:
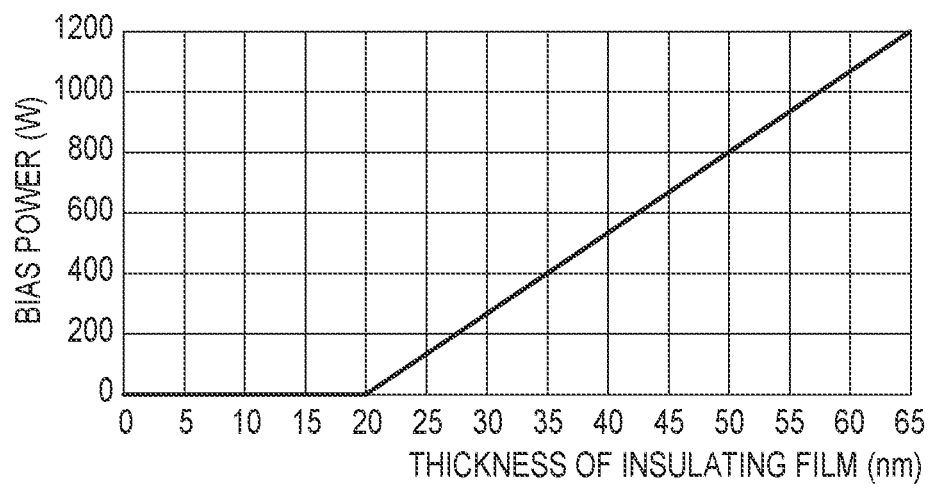
FIGS. 14A and 14B show graphs exemplifying a method of adjusting a sputtering action.

Parameters for adjusting the degree of the sputtering action include, for example, bias power supplied to the bias electrode provided in the substrate holder that supports the target on which the insulating film 120 is to be formed, and a flow rate of Ar gas supplied to a film formation chamber. In the first example, the sputtering action is adjusted by setting, as film formation conditions, $SiH_4$ gas flow rate=105 sccm, $O_2$ gas flow rate=150 sccm, and Ar gas flow rate=240 sccm. In the first example, as shown in FIG. 14A, the insulating film 120 is grown to have a thickness of 20 nm while keeping the bias power at 0 W (first step). After that, until the insulating film 120 has a thickness of 65 nm, the bias power is linearly increased from 0 W to 1,200 W (second step).

Figure 14B:
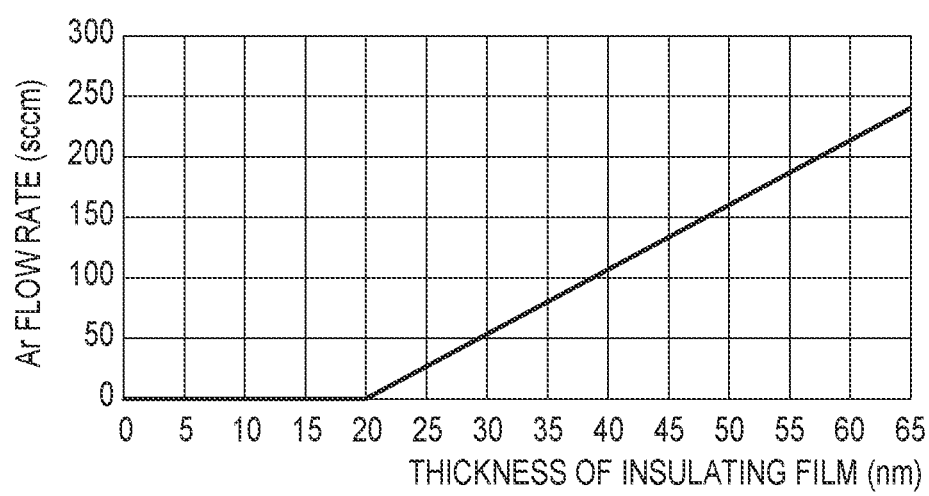

In the second example, the Ar gas flow rate is adjusted to adjust sputtering components by setting $SiH_4$ gas flow rate=105 sccm, $O_2$ gas flow rate=150 sccm, and bias power=1,200 W. In the second example, as shown in FIG. 14B, the insulating film 120 is grown to have a thickness of 20 nm by setting the Ar gas flow rate to 0 sccm (first step). After that, until the insulating film 120 has a thickness of 65 nm, the Ar gas flow rate is linearly increased from 0 sccm to 240 sccm (second step).

In the first and second examples, the roughness of the upper face of each first electrode 110 (the height difference of the upper face of each first electrode 110) is suppressed to 15 nm or smaller at most. On the other hand, in a comparative example in which the insulating film 120 is formed under a film formation condition that the sputtering action is exerted in an early stage of formation of the insulating film 120, the roughness of the upper face of each first electrode 110 (the height difference of the upper face of each first electrode 110) is 65 nm at most. In the first and second examples, the reflectance of each first electrode 110 when the insulating film 120 is formed is improved by 7%, as compared to the comparative example.

FIGS. 13A and 13B exemplify the relationship between positions in the thickness direction in the formed insulating film 120 and Ar contents at these positions, according to the fifth embodiment. An Ar content at a lowest position A is smallest. An Ar content at a position B higher than the position A is larger than that at the position A. An Ar content at a position C higher than the position B is larger than that at the position B. Note that growth of the insulating film 120 progresses in order of the positions A, B, and C. A change in Ar content can be analyzed by, for example, TEM-EDX or the like. In a structure in which the Ar content continuously changes in the thickness direction of the insulating film 120, there is no refractive index step in the insulating film 120, thereby making it possible to suppress stray light caused by unintended refraction in the insulating film 120.

As the parameters for adjusting the degree of the sputtering action, in addition to the above-described parameters, for example, the ion density generated in the film formation chamber can be increased. For example, the ion density in the first step can be made lower than that in the second step.

The sixth embodiment of the present invention will be described below with reference to FIGS. 15A and 15B. The sixth embodiment is a modification of the fifth embodiment. Matters which are not mentioned as the sixth embodiment can comply with the fifth embodiment. In the sixth embodiment, an insulating film 120 is formed by a first insulating layer 121 and a second insulating layer 122. In the sixth embodiment, a step of forming the insulating film 120 includes the first step, and the second step performed after the first step. In the first step, the first insulating layer 121 as a part of the insulating film 120 is formed under the first condition. In the second step, the second insulating layer 122 as another part of the insulating film 120 is formed under the second condition that a deposition action and a sputtering action compete with each other. Under the first condition, no sputtering action occurs. Therefore, the sputtering action under the first condition is weaker than that under the second condition.

For example, in the first step, a silicon oxide layer can be formed as the first insulating layer 121 using a parallel flat plate type plasma CVD method. In the second step, a silicon oxide layer can be formed as the second insulating layer 122 by the high-density plasma CVD method. Unlike the high-density plasma CVD method, the parallel flat plate type plasma CVD method is a film formation method in which no sputtering action occurs. A film formed under a condition that the sputtering action is strong has an Ar content higher than that of a film formed under a condition that the sputtering action is weak. Therefore, the Ar content of the second insulating layer 122 is higher than that of the first insulating layer 121.

In an example, in the first step, a TEOS film having a thickness of 40 nm is formed as the first insulating layer 121 in a CVD apparatus by the parallel flat plate type plasma CVD method. At this time, a TEOS film can be formed as the first insulating layer 121 at a temperature of 400° C. or lower so as to prevent the upper face of each first electrode 110 from being roughened due to the influence of heat. The difference between the temperature when forming the first electrodes 110 and that when forming the first insulating layer 121 is preferably set to a value lower than 100° C. This can suppress a thermal stress (distortion stress) after formation of the first insulating layer 121, thereby readily maintaining the smoothness of the upper face of each first electrode 110.

In the parallel flat plate type plasma CVD method, the first insulating layer 121 is formed to cover the upper and side faces of each first electrode 110. The parallel flat plate type plasma CVD method is more advantageous than the high-density plasma CVD method in terms of thinning the first insulating layer 121 on the upper face of each first electrode 110 and sufficiently covering the side face of each first electrode 110.

In the second step, a TEOS film having a thickness of 25 nm can be formed as the second insulating layer 122 in a high-density plasma CVD apparatus using the high-density plasma CVD method. In the high-density plasma CVD method, the second insulating layer 122 is formed while the deposition action and the sputtering action compete with each other. The surface of a part where the second insulating layer 122 formed using the high-density plasma CVD method covers the side face of each first electrode 110 is smoother than the surface of a part where the first insulating layer 121 formed using the parallel flat plate type plasma CVD method covers the side face of each first electrode 110. This allows the insulating film 120 to more surely cover the side face of each first electrode 110.

Figure 15A:
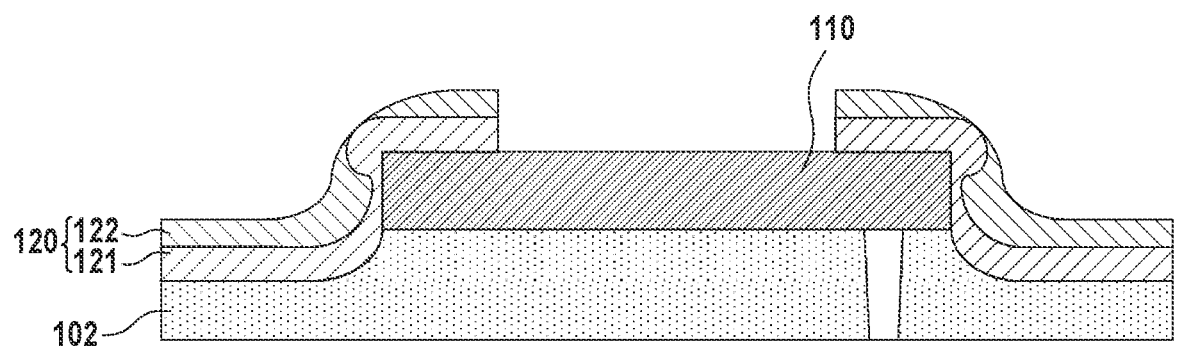
FIGS. 15A and 15B show views each schematically showing the sectional structure of a display device according to the sixth embodiment.
Figure 15B:
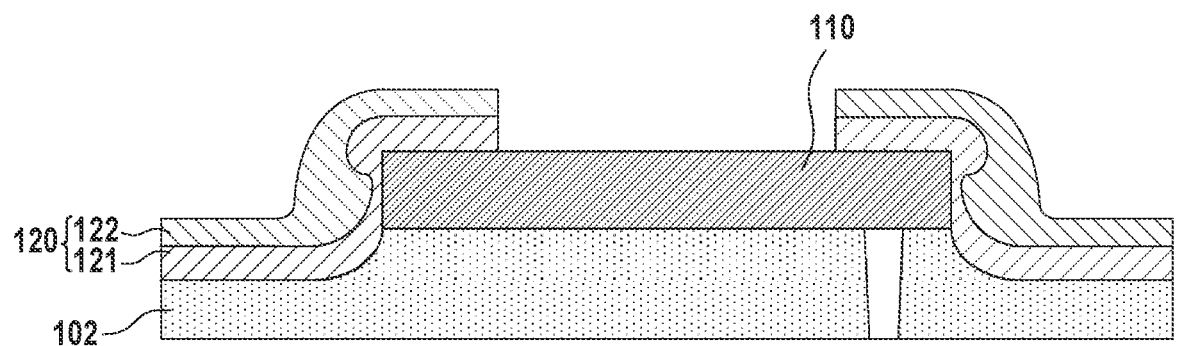

As exemplified in FIG. 15A, the first insulating layer 121 may form a part of the surface of the insulating film 120. Alternatively, as exemplified in FIG. 15B, the second insulating layer 122 may form the surface of the insulating film 120. For example, in the second step, the sputtering action can be adjusted by adjusting the bias power and/or the ion density, thereby adjusting the shape of the surface of the insulating film 120.

Figure 16:
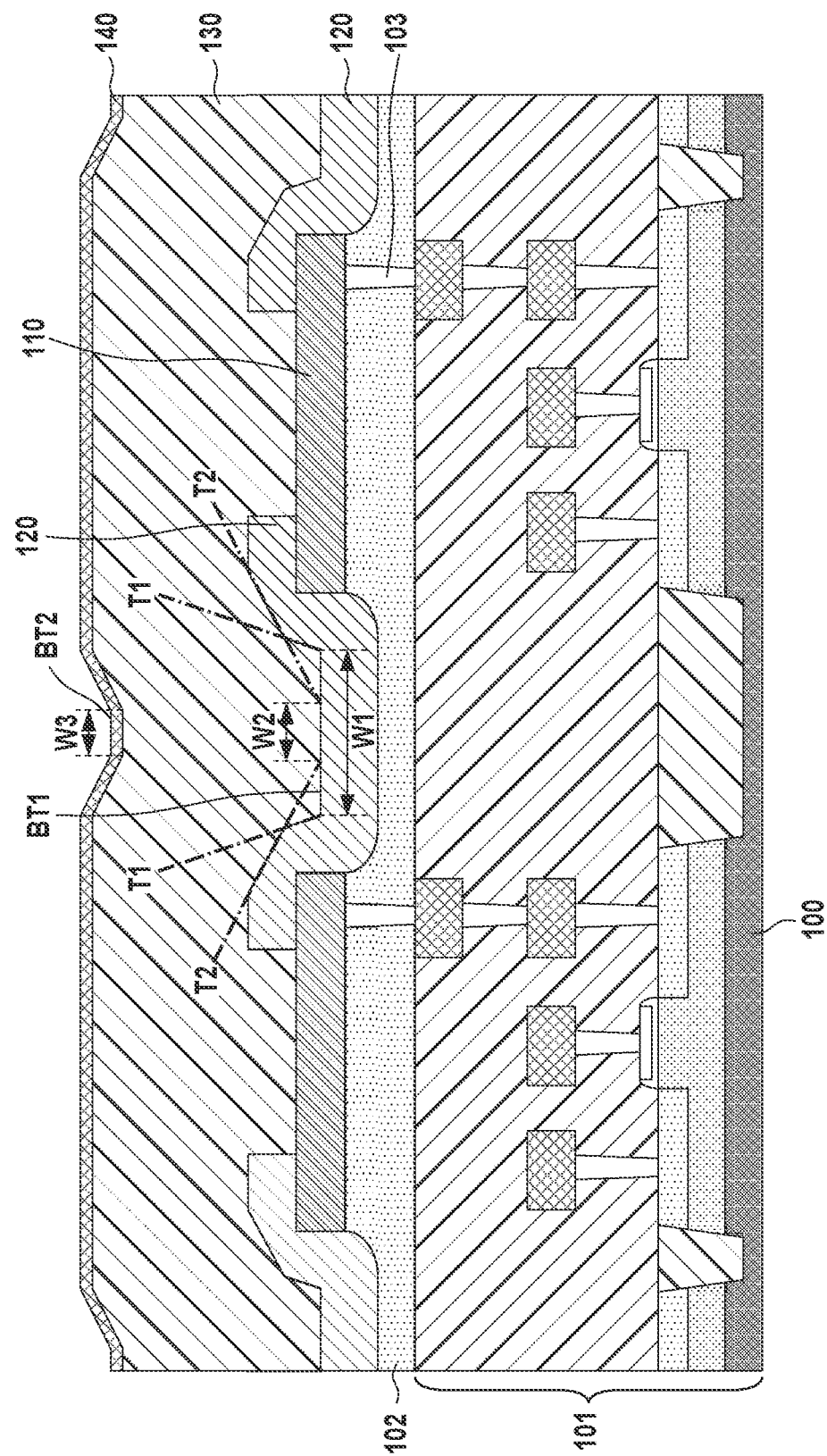
FIG. 16 is a view schematically showing the sectional structure of a display device according to the seventh embodiment.

The seventh embodiment of the present invention will be described below with reference to FIG. 16. The seventh embodiment is a modification of the fifth embodiment. Matters which are not mentioned as the seventh embodiment can comply with the fifth embodiment. In the seventh embodiment, a step of forming an insulating film 120 includes the first step, and the second step performed after the first step. In the first step, a part of the insulating film 120 is formed under the first condition that the deposition action and the sputtering action compete with each other. In the second step, another part of the insulating film 120 is formed under the second condition that the deposition action and the sputtering action compete with each other. The sputtering action under the first condition is weaker than that under the second condition. In the seventh embodiment, the first and second conditions are different in bias power supplied to a bias electrode provided in a substrate holder that supports a target on which the insulating film 120 is to be formed. Alternatively, in the seventh embodiment, the first and second conditions are different in Ar gas flow rate.

Two kinds of inclinations (gradients) are formed on the upper face of the insulating film 120 in the first and second steps. An inclination on the lower side is represented as an inclination T1 and an inclination on the upper side is represented as an inclination T2. Furthermore, a distance from the intersection point of the inclination Ti of one of two adjacent first electrodes 110 and a bottom face BT1 of a concave part formed on the upper face of the insulating film 120 between the two adjacent first electrodes 110 to the intersection point of the inclination T1 of the other first electrode 110 and the bottom face BT1 is represented as a width W1. A distance from the intersection point of the inclination T2 of one of the two adjacent first electrodes 110 and the bottom face BT1 of the insulating film 120 between the two adjacent first electrodes 110 to the intersection point of the inclination T2 of the other first electrode 110 and the bottom face BT1 is represented as a width W2. As described above, an organic layer 130 is arranged on the first electrodes 110 and the insulating film 120, and a second electrode 140 is arranged on the organic layer 130. A concave part can be formed in the second electrode 140 at a position above the concave part formed on the upper face of the insulating film 120 between the two adjacent first electrodes 110. The width of a bottom face BT2 of the concave part of the second electrode 140 is represented by W3.

In a high-resolution display device 1, the distance between the first electrodes 110 can be small. This decreases the distances W1 and W2, and can also decrease the width W3. In this case, in the concave part of the second electrode 140, the resistance value of the second electrode increases due to a shadow effect. This can form a nonuniform voltage distribution in the second electrode 140 provided commonly to a plurality of sub-pixels, causing shading.

In the seventh embodiment, two kinds of inclinations (gradients) are formed in the first and second steps, and the width W1 of the flat part of the bottom face BT1 of the concave part formed on the upper face of the insulating film 120 between the adjacent first electrodes 110 can be increased. This can increase the width W3 of the bottom face BT2 of the concave part of the second electrode 140. That is, this can planarize the second electrode 140. Thus, it is possible to uniform the voltage distribution of the second electrode 140, thereby reducing shading.

In an example, the distance between the adjacent first electrodes 110 can be set to 0.6 μm, and the thickness of each first electrode 110 can be set to 100 nm. The insulating film 120 can be formed by a TEOS film (first insulating layer) having a thickness of 40 nm that is formed under the first condition so as to form the inclination T1, and a TEOS film (second insulating layer) having a thickness of 25 nm that is formed under the second condition so as to form the inclination T2. Furthermore, the thickness of the organic layer 130 can be set to 150 nm and the thickness of the second electrode 140 can be set to 15 nm.

The first insulating layer having a thickness of 40 nm is formed to set the inclination T1 at 70° (gradient=tan 70°), and the second insulating layer having a thickness of 25 nm is formed to set the inclination T2 at 50° (gradient=tan 50°). At this time, the width W3 of the bottom face BT2 of the concave part of the second electrode 140 is set to 0.1 μm.

On the other hand, as a comparative example, when an insulating film having a thickness of 65 nm, whose upper face is formed by a single inclined surface having an inclination angle of 50°, is formed as the insulating film 120, the width W3 of the bottom face BT2 of the concave part of the second electrode 140 is set to 0. That is, in the comparative example, since the part of the second electrode between the adjacent first electrodes includes only the inclined surface, a problem that a resistance value becomes large arises.

Figure 17:
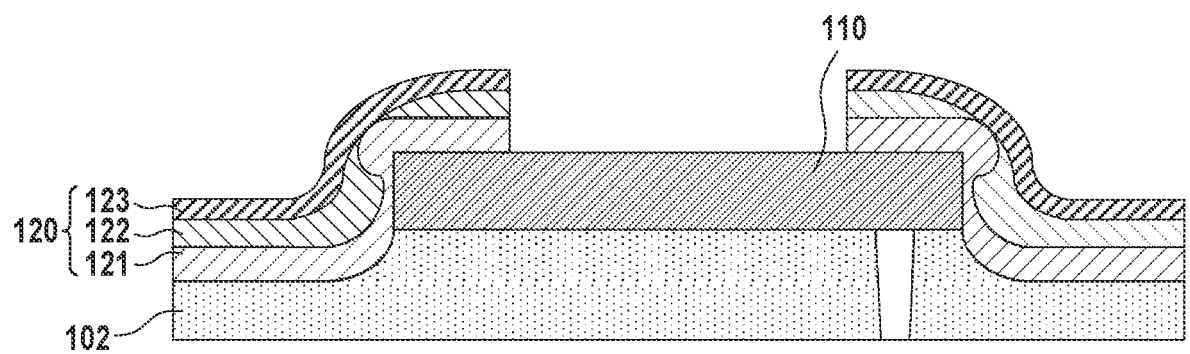
FIG. 17 is a view schematically showing the sectional structure of a display device according to the eighth embodiment.

The eighth embodiment of the present invention will be described below with reference to FIG. 17. The eighth embodiment is a modification of the fifth to seventh embodiments. Matters which are not mentioned as the eighth embodiment can comply with the fifth to seventh embodiments. In the eighth embodiment, an insulating film 120 is formed by three or more insulating layers that are formed while changing a film formation condition. For example, a first insulating layer 121 can be formed using the parallel flat plate type plasma CVD method, a second insulating layer 122 can be formed using the high-density plasma CVD method, and a third insulating layer 123 can be formed using the parallel flat plate type plasma CVD method. The first to third insulating layers 121, 122, and 123 are made of, for example, silicon oxide but may be made of another material. Alternatively, all or some of the first to third insulating layers 121, 122, and 123 may be made of different materials.

In an example, a TEOS film having a thickness of 30 nm is formed as the first insulating layer 121 using the parallel flat plate type plasma CVD method. A TEOS film having a thickness of 30 nm is formed as the second insulating layer 122 using the high-density plasma CVD method. A TEOS film having a thickness of 30 nm is formed as the third insulating layer 123 under the same condition as that for the first insulating layer 121.

A display device 1 described above can be incorporated in various electronic apparatuses. The electronic apparatuses include, for example, a camera, a computer, a mobile terminal, and an in-vehicle display device. Each electronic apparatus can include, for example, the display device 1 and a control unit that controls driving of the display device 1.

Figure 18:
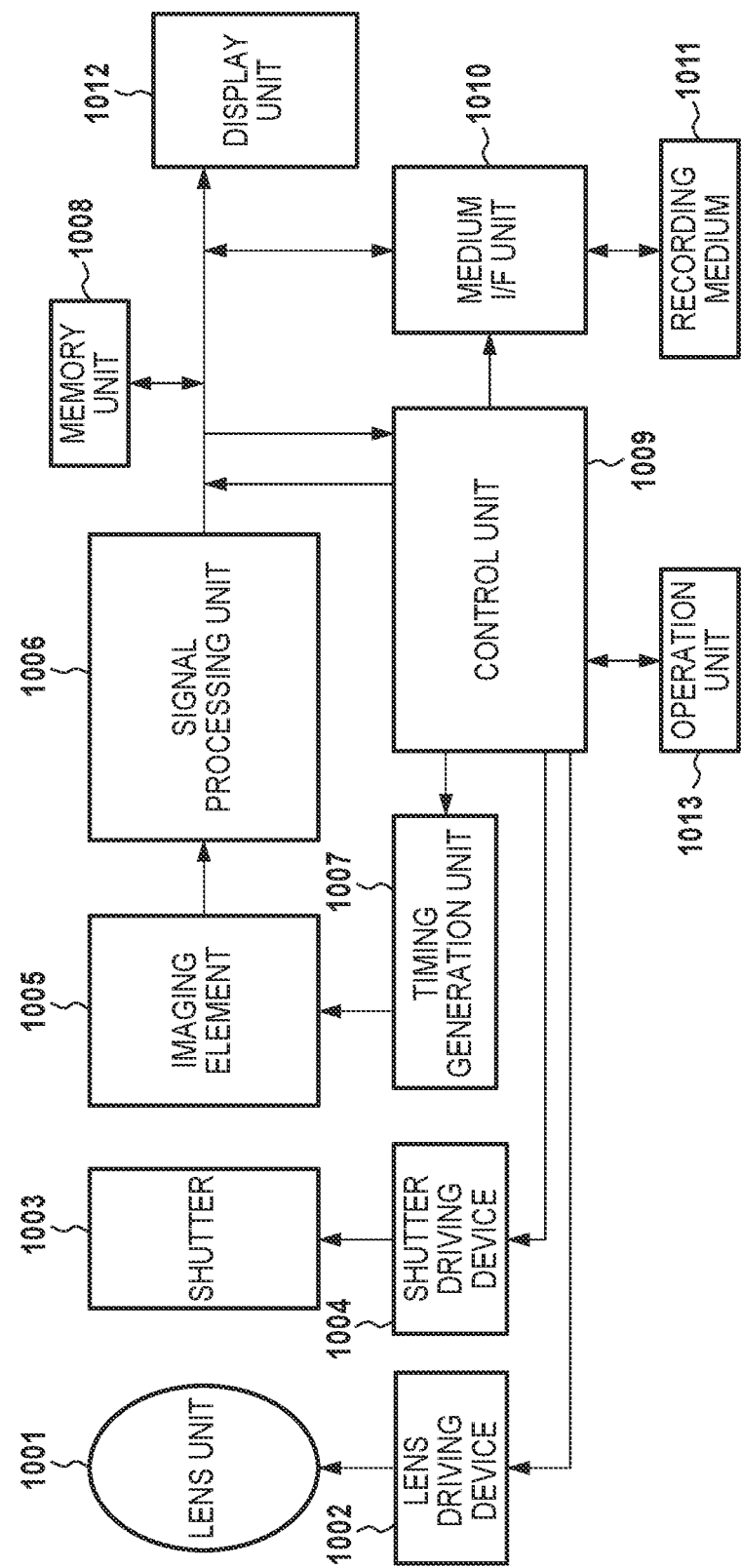
FIG. 18 is a block diagram showing an example of the arrangement of a camera according to the ninth embodiment.

An embodiment in which a display device 1 described above is applied to a display unit of a digital camera will be described with reference to FIG. 18. A lens unit 1001 is an imaging optical system that forms an optical image of an object on an imaging element 1005, and includes a focus lens, a zoom lens, and a stop. Driving of the focus lens position, the zoom lens position, the opening diameter of the stop, and the like in the lens unit 1001 is controlled by a control unit 1009 via a lens driving device 1002.

A mechanical shutter 1003 is arranged between the lens unit 1001 and the imaging element 1005, and its driving is controlled by the control unit 1009 via a shutter driving device 1004. The imaging element 1005 converts an optical image formed by the lens unit 1001 into an image signal by a plurality of pixels. A signal processing unit 1006 performs A/D conversion, demosaicing processing, white balance adjustment processing, encoding processing, and the like for the image signal output from the imaging element 1005.

A timing generation unit 1007 outputs various kinds of timing signals to the imaging element 1005 and the signal processing unit 1006. The control unit 1009 includes, for example, memories (ROM and RAM) and a microprocessor (CPU), and implements various kinds of functions of the digital camera by loading a program stored in the ROM into the RAM and causing the CPU to execute it to control the units. The functions implemented by the control unit 1009 include automatic focus detection (AF) and automatic exposure control (AE).

A memory unit 1008 is used by the control unit 1009 or the signal processing unit 1006 to temporarily store image data or as a work area. A medium I/F unit 1010 is an interface configured to perform read/write access to a recording medium 1011 that is, for example, a detachable memory card. A display unit 1012 is used to display a shot image or various kinds of information of the digital camera. The above-described display device 1 is applicable to the display unit 1012. The display device 1 mounted as the display unit 1012 on the digital camera is driven by the control unit 1009, and displays an image or various kinds of information. An operation unit 1013 includes user interfaces such as a power switch, a release button, and a menu button configured to allow a user to do an instruction or setting for the digital camera.

The operation of the digital camera at the time of image shooting will be described. When the power is turned on, a shooting standby state is set. The control unit 1009 starts moving image shooting processing of causing the display unit 1012 (display device 1) to operate as an electronic viewfinder, and display processing. If a shooting preparation instruction (for example, half stroke of the release button of the operation unit 1013) is input in the shooting standby state, the control unit 1009 starts focus detection processing.

The control unit 1009 obtains the moving amount and the moving direction of the focus lens of the lens unit 1001 based on the obtained defocus amount and direction, drives the focus lens via the lens driving device 1002, and adjusts the focus of the imaging optical system. After the driving, focus detection based on a contrast evaluation value may be further performed as needed to finely adjust the focus lens position.

After that, if a shooting start instruction (for example, full stroke of the release button) is input, the control unit 1009 executes a shooting operation for recording, processes obtained image data by the signal processing unit 1006, and stores it in the memory unit 1008. The control unit 1009 records, in the recording medium 1011 via the medium I/F unit 1010, the image data stored in the memory unit 1008. At this time, the control unit 1009 may drive the display unit 1012 (display device 1) to display a shot image. Furthermore, the control unit 1009 may output the image data from an external I/F unit (not shown) to an external device such as a computer.

According to the present invention, in a display device including an insulating film to cover the side face of each first electrode, there is provided a technique advantageous in improving the quality of the insulating film while relaxing a limitation on the constituent material of each first electrode.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-151762, filed Aug. 4, 2017, which is hereby incorporated by reference herein in its entirety.

What is claimed is:

1. A display device comprising first electrodes, a second electrode, an organic layer arranged between the first electrodes and the second electrode, and an insulating film configured to cover at least a side face of each of the first electrodes,
the insulating film including a first insulating layer configured to cover at least a part of the side face of each of the first electrodes, and a second insulating layer configured to cover the side face, the first insulating layer being arranged between the side face and the second insulating layer, and including a first part and a second part whose density is lower than a density of the first part.

2. The display device according to claim 1, wherein the first part includes a part that covers a peripheral part of an upper face of each of the first electrodes, and the second part is located in a side part of the side face of each of the first electrodes.

3. The display device according to claim 1, wherein each of the first electrodes includes a plurality of electrically conductive material layers, and
wherein at least one layer among the plurality of the electrically conductive material layers protrudes with respect to side faces of other electrically conductive material layers in a planar view with respect to an upper face of a first electrode.

4. The display device according to claim 3, wherein the first electrode is disposed over an interlayer insulating film, and wherein the second part is arranged between the at least one layer and an upper face of the interlayer insulating film.

5. The display device according to claim 3, wherein the plurality of the electrically conductive material layers includes a second electrically conductive material layer arranged under a first electrically conductive material layer, and wherein when D1 represents a maximum thickness of a part of the first insulating layer, which covers a side face of the first electrically conductive material layer, D2 represents a maximum thickness of a part of the first insulating layer, which covers a side face of the second electrically conductive material layer, D3 represents a maximum thickness of a part of the second insulating layer, which covers the side face of the first electrically conductive material layer, and D4 represents a maximum thickness of a part of the second insulating layer, which covers the side face of the second electrically conductive material layer, D3/D4>D1/D2 is satisfied.

6. The display device according to claim 5, wherein the side face of the first electrically conductive material layer is most protruded among the plurality of the electrically conductive material layers, and wherein the side face of the second electrically conductive material layer is most recessed among the plurality of the electrically conductive material layers.

7. The display device according to claim 3, wherein a thickness of the first insulating layer is larger than a thickness of a first electrically conductive material layer.

8. The display device according to claim 1, wherein the second insulating layer is arranged so as to fill a space between adjacent first electrodes and cover the second part.

9. The display device according to claim 1, wherein the side face of each of the first electrodes includes a step, and the first insulating layer and the second insulating layer have an overhang shape along the step.

10. The display device according to claim 1, wherein each of the first electrodes includes a plurality of electrically conductive material layers, the plurality of the electrically conductive material layers including a first electrically conductive material layer whose side face protrudes most among the plurality of the electrically conductive material layers in a planar view with respect to an upper face of a first electrode, and a thickness of the first insulating layer is larger than a thickness of the first electrically conductive material layer.

11. The display device according to claim 1, wherein a thickness of the first insulating layer is larger than a thickness of the second insulating layer.

12. The display device according to claim 1, wherein the insulating film includes a third insulating layer configured to cover the second insulating layer.

13. An electronic apparatus comprising:
a display device defined in claim 1; and
a control unit configured to control the display device.

14. A display device comprising first electrodes, a second electrode, an organic layer arranged between the first electrodes and the second electrode, and an insulating film configured to cover at least a side face of each of the first electrodes, the insulating film including a first insulating layer configured to cover at least a part of the side face of each of the first electrodes, and a second insulating layer configured to cover the side face, wherein an Ar content of the second insulating layer is higher than an Ar content of the first insulating layer.

* * * * *